United States Patent [19]

Inoue et al.

[11] Patent Number: 4,662,949

[45] Date of Patent: May 5, 1987

[54] METHOD OF FORMING A SINGLE CRYSTAL SEMICONDUCTOR LAYER FROM A NON-SINGLE CRYSTALLINE MATERIAL BY A SHAPED ENERGY BEAM

[75] Inventors: Tomoyasu Inoue, Tokyo; Hiroyuki Tango, Yokohama; Kyoichi Suguro, Kawasaki; Iwao Higashinakagawa, Kawasaki; Toshihiko Hamasaki, Kawasaki, all of Japan

[73] Assignee: Director-General of Agency of Industrial Science and Technology, Tokyo, Japan

[21] Appl. No.: 762,374

[22] Filed: Aug. 5, 1985

[30] Foreign Application Priority Data

| Feb. 15, 1985 [JP] | Japan | 60-26181 |
| Apr. 10, 1985 [JP] | Japan | 60-74373 |
| Apr. 10, 1985 [JP] | Japan | 60-74374 |
| Apr. 10, 1985 [JP] | Japan | 60-74375 |
| Apr. 10, 1985 [JP] | Japan | 60-74376 |
| Apr. 19, 1985 [JP] | Japan | 60-82299 |

[51] Int. Cl.$^4$ .................. H01L 21/263; H01L 21/208
[52] U.S. Cl. .................... 148/1.5; 29/576 B; 29/576 T; 148/187; 148/DIG. 93; 156/612; 156/620; 427/53.1
[58] Field of Search ............... 148/1.5, 187; 29/576 B, 29/576 T; 427/53.1; 156/612, 620

[56] References Cited

U.S. PATENT DOCUMENTS

| 4,315,130 | 2/1982 | Inagaki et al. | 148/DIG. 93 |
| 4,406,709 | 9/1983 | Celler et al. | 148/1.5 |
| 4,473,433 | 9/1984 | Bosch et al. | 156/620 |
| 4,564,403 | 1/1986 | Hayafuji et al. | 148/171 |

FOREIGN PATENT DOCUMENTS

0148421 11/1980 Japan ..................... 148/DIG. 93

OTHER PUBLICATIONS

Zorabedian et al. in Mat. Res. Soc. Proc., vol. 13, ed. Narayan et al., N. Holland, N.Y., 1982, p. 523.
Stultz et al., Appl. Phys. Letts.

*Primary Examiner*—Upendra Roy
*Attorney, Agent, or Firm*—Oblon, Fisher, Spivak, McClelland & Maier

[57] ABSTRACT

In an apparatus for forming a single crystal semiconductor layer from a non-single-crystalline semiconductor material by scanning a region of the material with an electron beam, a first pair of deflection electrodes and a second pair of deflection electrodes, both pairs being provided in the path of the electron beam. A deflection signal generated by modifying the amplitude of a high-frequency fundamental wave signal with a modulation wave signal having a frequency lower than that of the high-frequency fundamental wave signal is supplied to the deflection electrodes of the first pair. The electrodes rapidly deflect the electron beam in a first direction, while changing the range of deflecting the beam, thereby forming a locus of the beam spot on the sample. Simultaneously, the deflection electrodes of the second pair deflect the beam in a second direction, thereby annealing a region of the material, to form a single crystal semiconductor layer.

32 Claims, 44 Drawing Figures

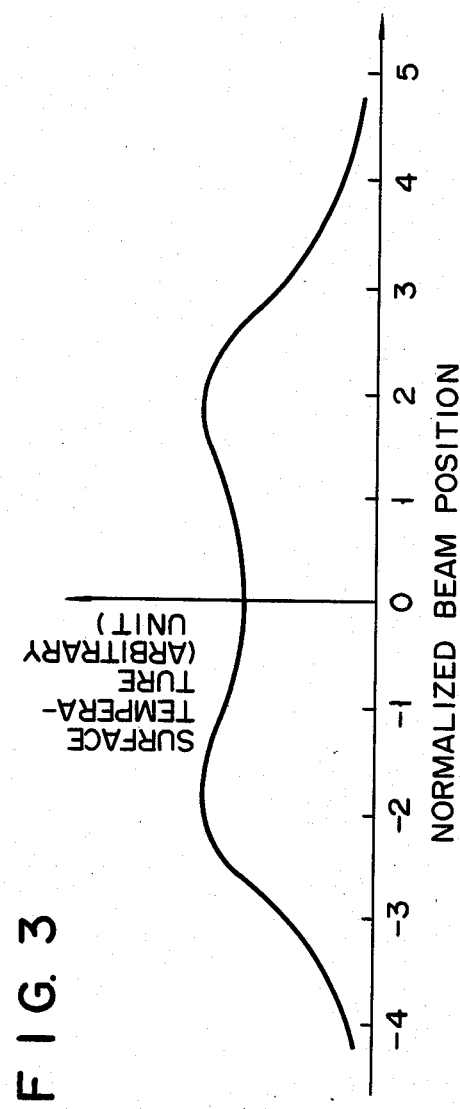
F I G. 3
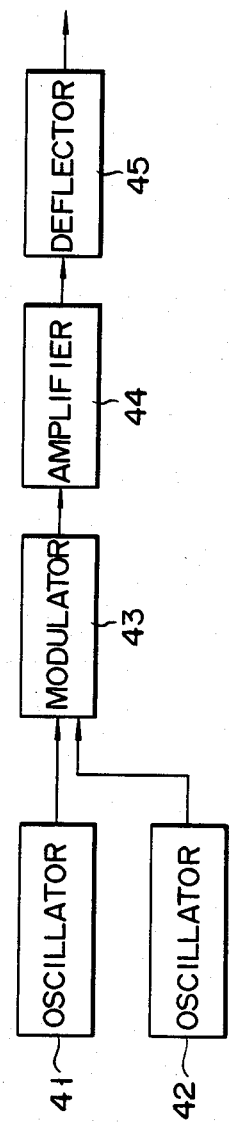
F I G. 6

F I G. 5
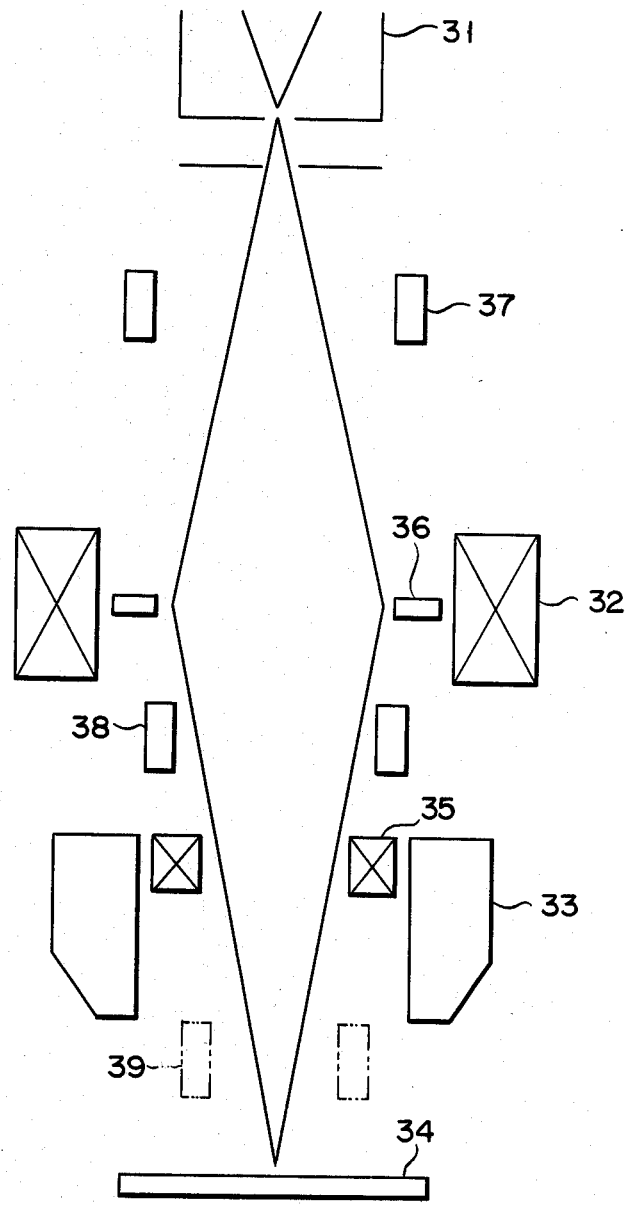

F I G. 8
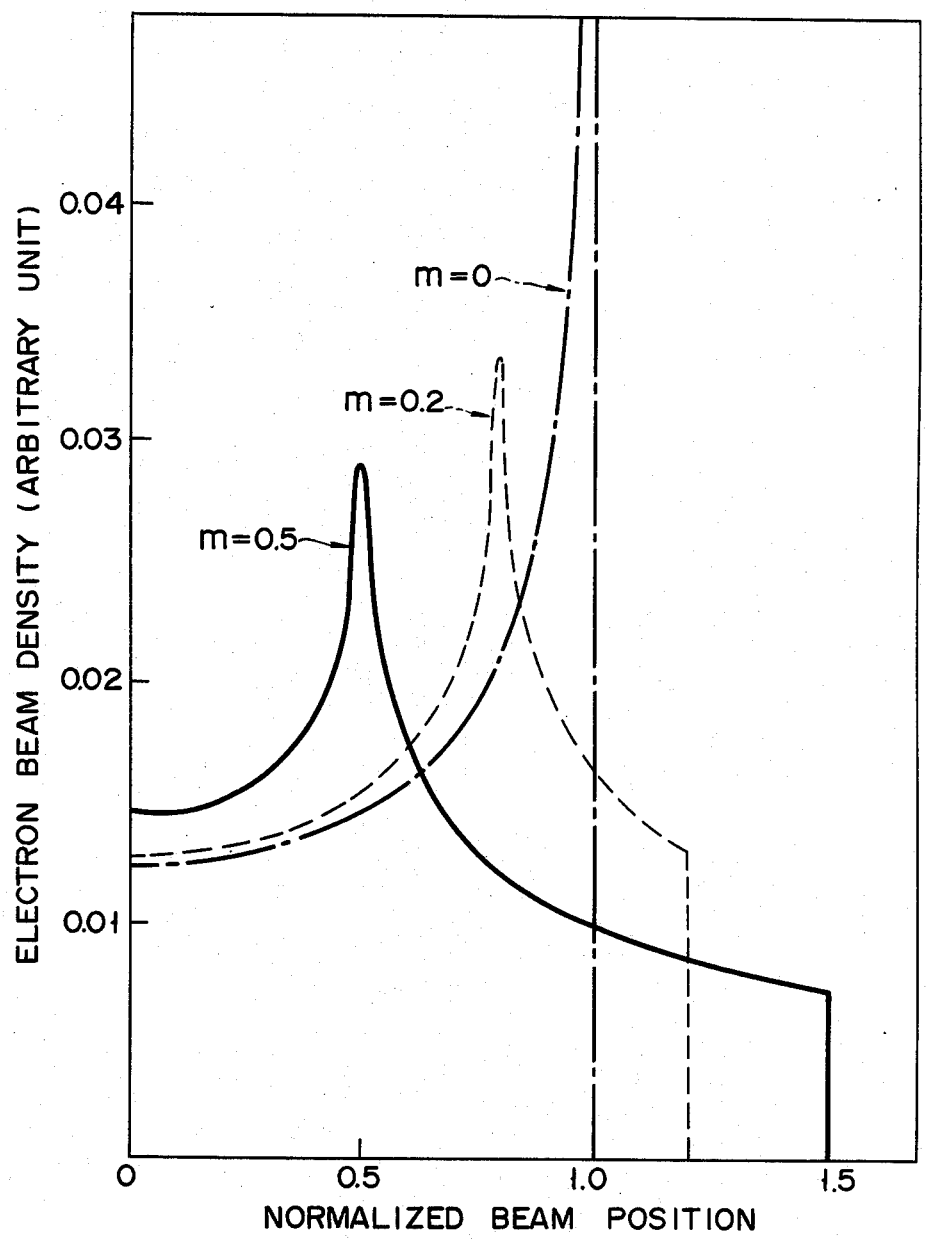

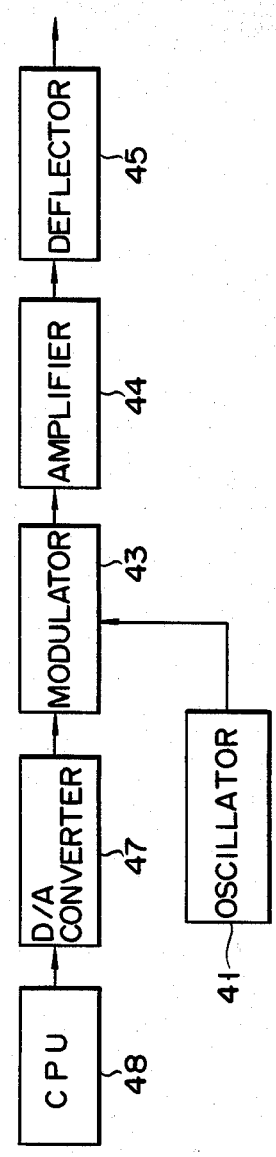
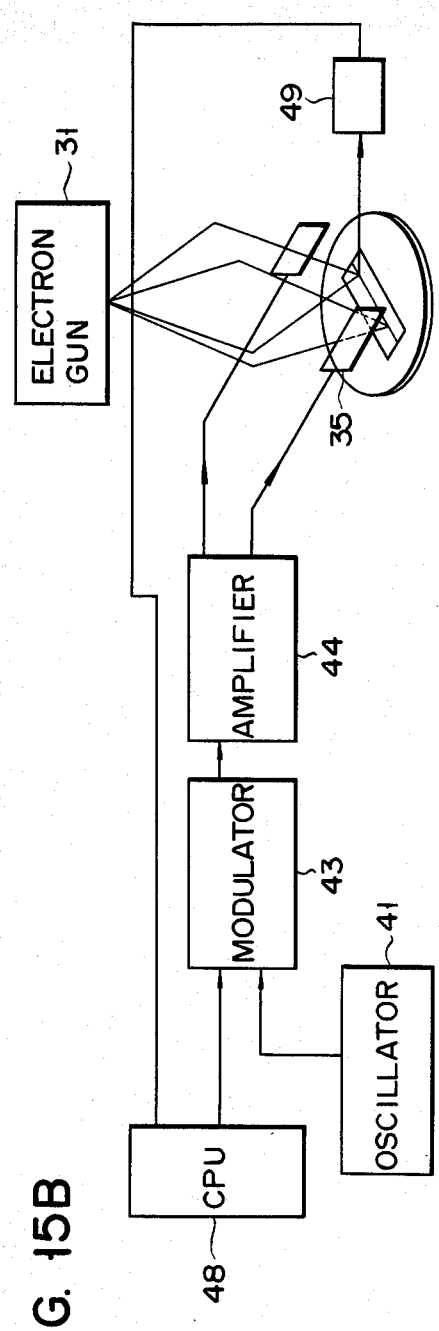
FIG. 15A
FIG. 15B

F I G. 16
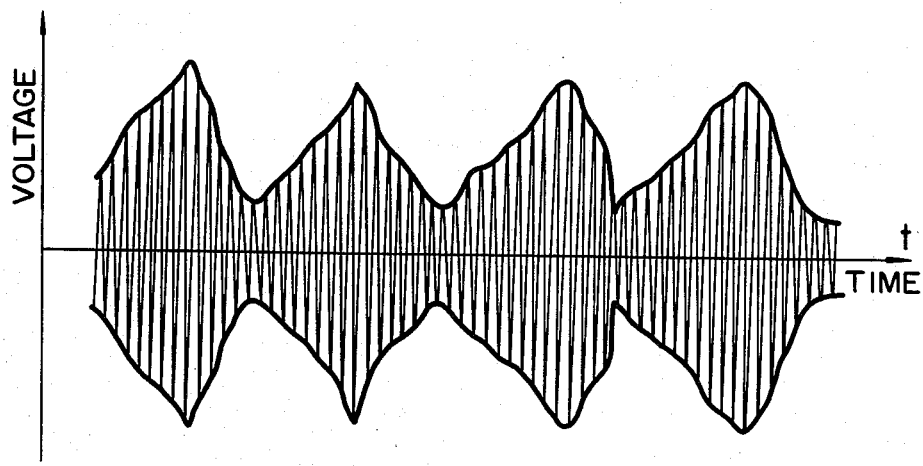
F I G. 17
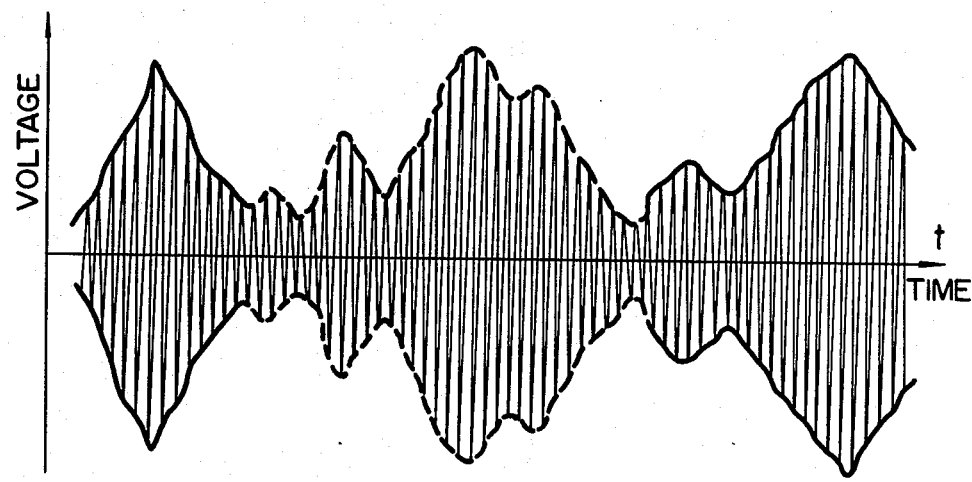

F I G. 35
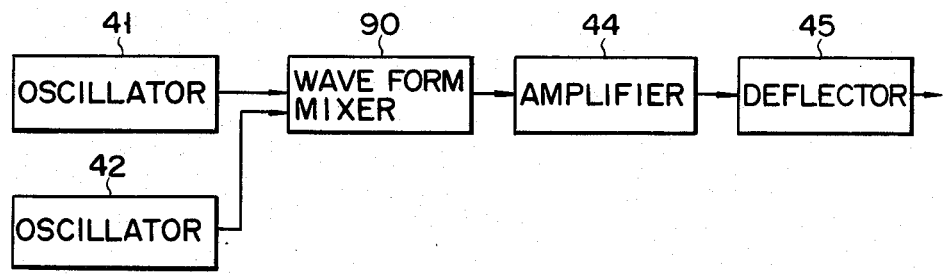
F I G. 36
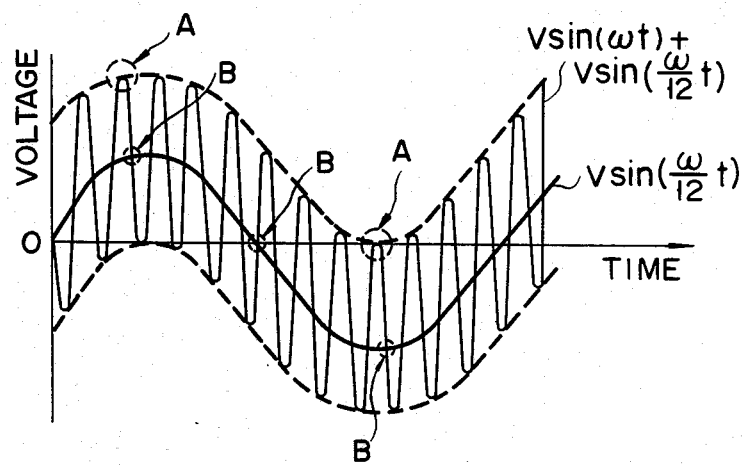

METHOD OF FORMING A SINGLE CRYSTAL SEMICONDUCTOR LAYER FROM A NON-SINGLE CRYSTALLINE MATERIAL BY A SHAPED ENERGY BEAM

BACKGROUND OF THE INVENTION

The present invention relates to a method of forming a single crystal semiconductor layer from a non-single-crystalline material, and an apparatus for forming the same. More particularly, it relates to a method of forming a single crystal semiconductor layer from a non-single-crystalline material by scanning the surface of the material with an electron beam in a first direction while rapidly deflecting the beam in a second direction perpendicular to the first direction, and an apparatus for forming the same by scanning the surface of the material with an electron beam in this manner.

Recently, various methods of forming SOI (silicon on insulator) layers, using electron beam annealing, have been developed to be used in the semiconductor industry. These methods comprise the steps of forming an insulative layer of silicon dioxide or silicon nitride on a single crystal silicon substrate, depositing a non-single-crystalline layer such as a polycrystalline or amorphous silicon layer on the insulative layer, and applying an electron beam or a laser beam to the polycrystalline or amorphous silicon layer, thus annealing this layer and recrystallizing the silicon, and forming a layer of single crystal silicon.

In the known method described above, a converged electron beam having Gaussian distribution scans a surface region of a non-single-crystalline layer in the X and Y directions, thereby annealing this region. The electron beam used in this method has a diameter of 10–500 μm. Therefore, the surface region, which is melted as the beam scans the substrate along a line, has a width equal to about the diameter of the beam. A crystal grain bundary is inevitably formed in a surface region on which the scanning lines are overlapped. In view of this, the method is not suitable for forming a relative large area of single crystal silicon.

Very recently, a new method of forming an SOI layer has been invented. In this new method, such a sine wave voltage having a relatively high frequency as is shown in FIG. 1B is applied to deflection electrodes, which rapidly deflect an electron beam in the Y direction to produce a so called pseudo-line-shaped beam, thus forming a straight locus of the beam spot on the substrate, while the beam is scanning a substrate in the X direction, as shown in FIG. 1A. This method is regarded as promising since the length of the straight locus of the beam spot is determined by the deflection angle, and theoretically there is no limit to the length of this locus. However, the greater the deflection angle, the lower the surface temperature of the scanned substrate, as shown in FIG. 2. The surface region of the semiconductor substrate must be sufficiently heated to form a semiconductor, single crystal layer. Therefore, when the electron beam is deflected at a large angle, a greater current must be supplied to an electron gun so that the gun may emit a more intense electron beam. Here arises a problem. The electron gun has its own luminance characteristic. The intensity of the electron beam cannot increase, no matter how great the current supplied to the gun. Hence, the maximum length of the straight locus of the beam spot is limited by the luminance characteristic of the electron gun.

The surface temperature distribution of the surface of the non-single-crystalline material scanned by the method described above is not uniform along the straight locus of the beam. Moreover, the intensity distribution of the beam on the surface of the material is not uniform since the sine wave voltage (FIG. 1B) is applied to the deflection electrodes. FIG. 3 shows the surface temperature distribution of a non-single-crystalline semiconductor material, along the straight locus of the beam spot. As this figure shows, two portions of the semiconductor material, near the ends of the locus of the beam spot, are heated to a temperature higher than any other portion. When these two portions are properly melted, the portion at the middle of the straight locus is insufficiently melted. As a result, the surface of the semiconductor material is not uniformly annealed.

To avoid such a non-uniform melting, a triangular wave signal, not a sine wave signal, may be applied to the deflection electrodes. This is because, the use of a triangular wave signal may make the probability of the beam spot staying at a point on the semiconductor material, uniformly distributed along the straight locus of the beam spot. This method is ineffective when the frequency of the deflection voltage is relatively high. The higher the frequency of the signal, the more the triangular waveform is distorted to become similar to a sine wave. Consequently, said probability varies along the straight locus of the electron beam spot. The deflection signal must have a frequency in the order of MHz. As shown in FIG. 4, the higher the frequency of the deflection signal, the less the probability varies along the locus, and the less the surface temperature changes along the straight locus of the beam spot. The change of the probability is negligibly small when a signal having a frequency of about 2 MHz or more is applied to the deflection electrodes.

As mentioned above, various drawbacks are inherent in the known method, wherein a sine wave signal or a triangular wave signal is applied to the deflection electrodes to rapidly deflect a converged electron beam in the Y direction while scanning a non-single-crystalline material in the X direction. It is difficult in this method to form a semiconductor, single crystal layer of an even composition.

SUMMARY OF THE INVENTION

Accordingly, the object of the present invention is to provide a method of forming a good single crystal layer from a non-single-crystalline material by scanning the material surface with an energy beam while rapidly deflecting the beam, thus forming a locus of the beam spot on the material surface. Another object of the invention is to provide an apparatus for forming such a semiconductor single crystal layer on a from a non-single-crystalline material.

In the method and apparatus according to this invention, the range in which the energy beam is rapidly deflected is changed, thus varying the width of the scanned region of a non-single-crystalline material. The sample is scanned in a direction different from the direction in which the beam is rapidly deflected, thereby forming a large area of a semiconductor single crystal layer. In some preferred embodiments of the invention, the energy beam is rapidly deflected by a deflection signal generated by modulating the amplitude of a high-frequency fundamental wave. When the energy beam is an electron beam, it is rapidly deflected by a deflection signal generated by amplitude-modulating the fundamental wave signal with a modulation wave signal of a lower frequency, whereby the intensity of the locus of the beam spot is evenly distributed. This makes it possible to form a broad, semiconductor single crystal layer from a non-single-crystalline material.

BRIEF DESCRIPTION OF THE DRAWINGS

FIG. 3 illustrates the distribution of the surface temperature of the non-single-crystalline material along the straight locus of the beam spot;

FIG. 5 shows an electron beam annealing apparatus according to the invention;

FIG. 6 is a block diagram showing a circuit for supplying a high-frequency deflection wave signal to the apparatus of FIG. 5;

FIG. 8 is a graph showing how the probability, for the beam spot to stay at a specific point on the surface of sample 24, varies along the straight locus of the beam spot as the degree of amplitude modulation is changed;

FIG. 15A is a block diagram of still another circuit for applying a high-frequency deflection wave signal to the apparatus of FIG. 5;

FIG. 15B is a block diagram of a circuit for monitoring the surface temperature of the sample;

FIG. 16 shows the waveform of a deflection signal generated by a CPU by combining linear functions;

FIG. 17 shows the waveform of a deflection signal generated by a CPU by combining quadratic functions;

FIG. 35 is a block diagram of a circuit for mixing a fundamental wave signal and a modulation wave signal, thus generating a high-frequency deflection signal whose base level periodically changes; and FIG. 36 shows the waveform of the high-frequency deflection signal generated by the circuit of FIG. 35.

DETAILED DESCRIPTION OF THE PREFERRED EMBODIMENTS

Figure 1A:
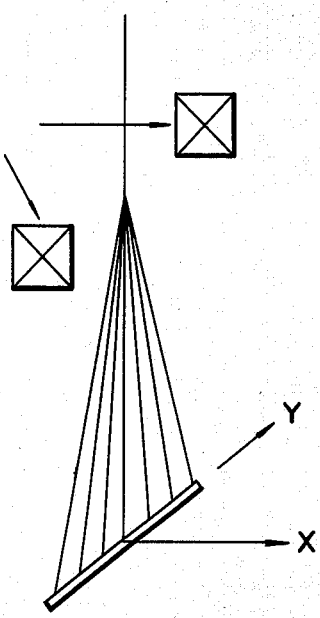
FIGS. 1A and 1B schematically show a conventional apparatus for scanning a sample with an electron beam in one direction, while rapidly deflecting the beam in another direction perpendicular to the first direction, thus forming a straight locus of the beam spot on the sample.
Figure 1B:
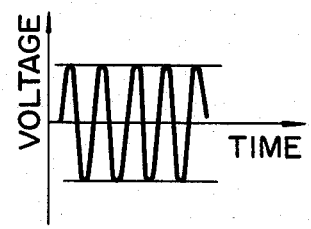
Figure 2:
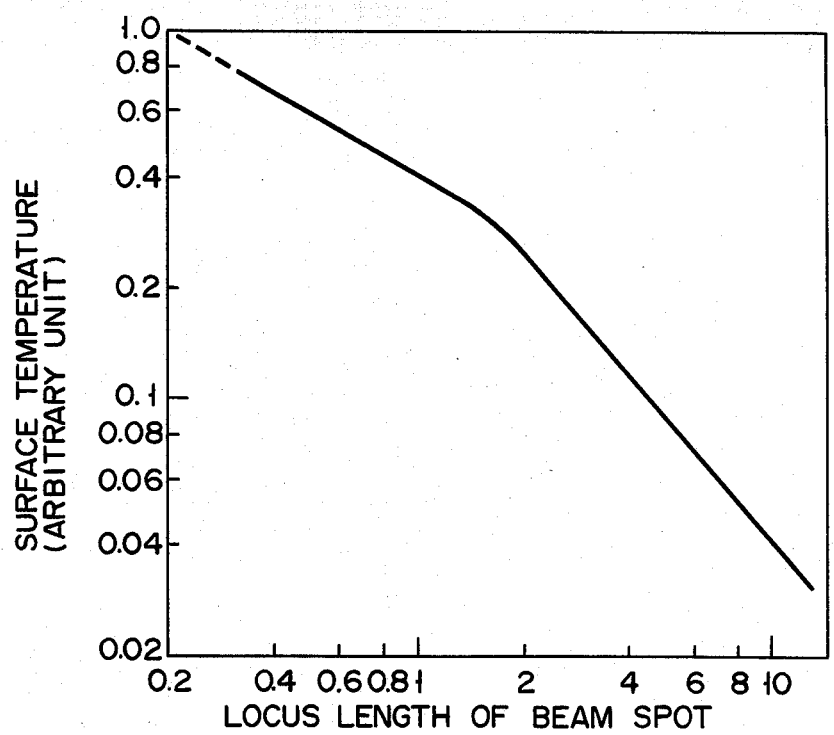
FIG. 2 shows the relationship between the length of the locus of the beam spot and the surface temperature of the non-crystalline-material.
Figure 4:
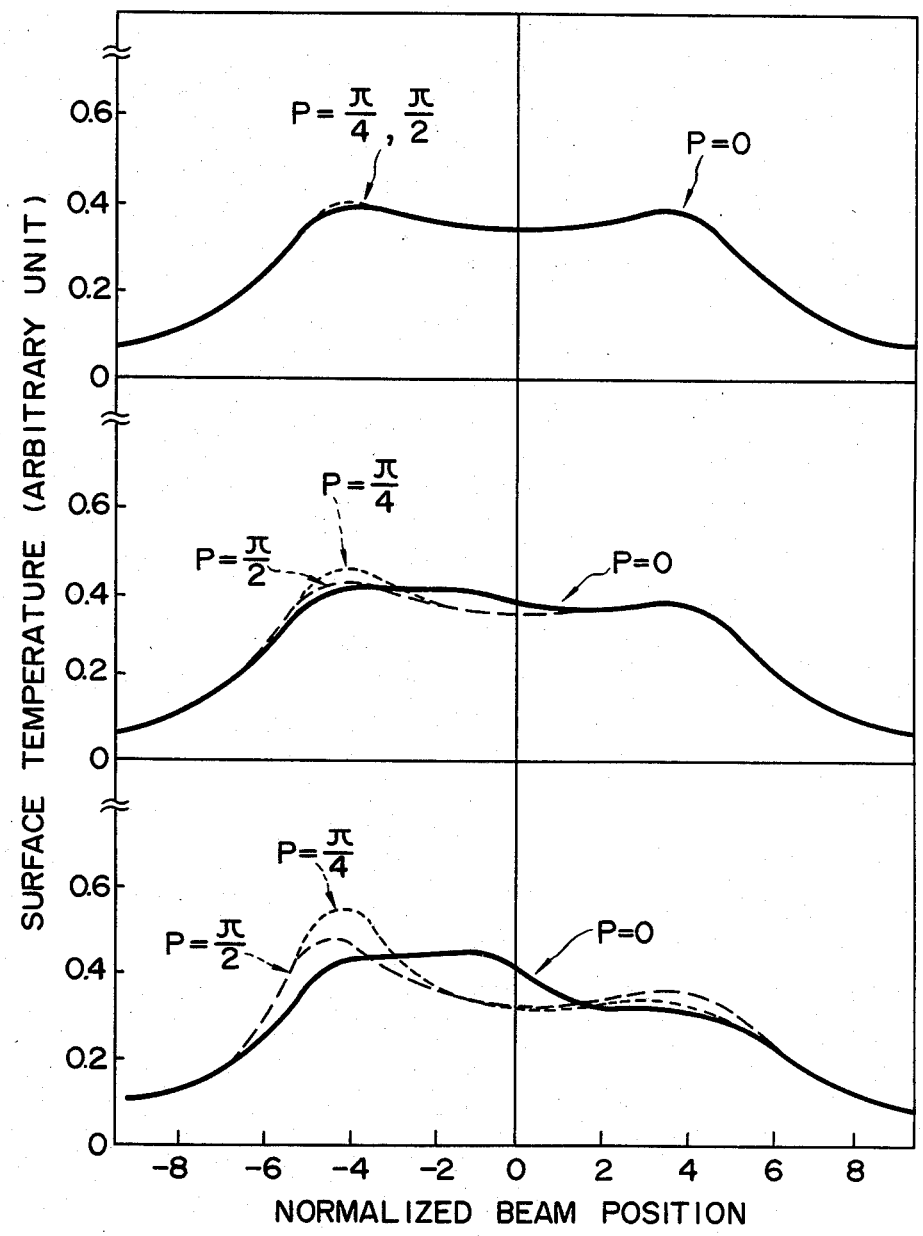
FIG. 4 shows the various distributions of the surface temperature along the locus of the beam spot, which are observed when deflection wave signals of different frequencies are used.

FIG. 5 shows an electron beam annealing apparatus, according to the present invention. The apparatus comprises an electron gun 31, a converging lens 32, an objective lens 33, a scanning coil unit (i.e., first deflector) 35, an aperture mask 36, a blanking electrode 37, and deflection electrodes (i.e., second deflector) 38. Electron gun 31 emits an electron beam. This beam is converged by converging lens 32 and then by objective lens 33. The converged beam is applied to sample 34. Unit 35 deflects the beam, thereby scanning sample 34 semiconductor sample or targe 34 consists of a single crystal silicon substrate, an insulative layer of silicon oxide or silicon nitride formed on the substrate, and non-single-crystalline semiconductor layer such as a polycrystalline or amorphous silicon layer formed on the insulative layer. Scanning coil unit 35 comprises a first deflection coil for deflecting the beam in the X direction and a second deflection coil for deflecting the beam in the Y direction. Aperture mask 36 is mounted on the principal surface of lens 32. Blanking electrodes 37 are provided between gun 31 and lens 32. When they are energized, they prohibit the passage of the beam emitted from gun 31. Deflection electrodes 38 are provided between lens 32 and coil unit 35. They oppose each other in the Y direction, to thereby rapidly deflect the electron beam in the Y direction to form a so called pseudo-line-shaped electron beam. Another deflector may be used to rapidly deflect the beam in the X direction. When the distance between electron gun 31 and sample 34 is relatively long, deflection electrodes 38 may be replaced by deflection electrodes 39 provided below scanning coil unit 35.

First Embodiment

Figure 7:
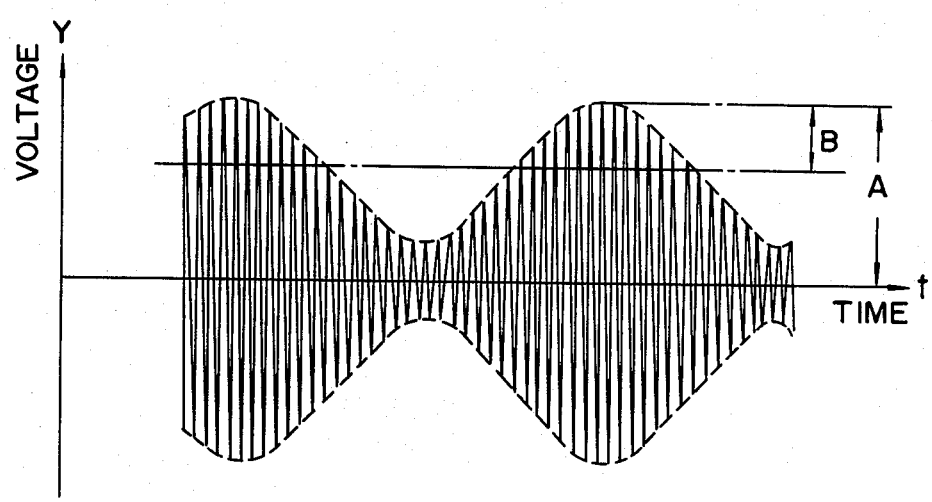
FIG. 7 shows the waveform of a deflection wave signal for rapidly deflecting the electron beam, which has been generated by modulating the amplitude of a fundamental wave signal with a sine wave modulation signal.

FIG. 6 is a block diagram of the circuit for applying a high-frequency signal to deflection electrodes 38, according to the first embodiment of the present invention. This circuit comprises a first oscillator 41, a second oscillator 42, a modulator 43, an amplifier 44 and a deflector 45. First oscillator 41 generates a high-frequency voltage signal, i.e., a fundamental wave signal, for rapidly deflecting the electron beam to form a pseudo-line-shaped electron beam. Second oscillator 41 generates a modulation wave signal whose frequency is lower than that of the fundamental wave signal. The output signals of oscillators 41 and 42 are supplied to modulator 43. Modulator 43 amplitude-modulates the high-frequency voltage signal by the modulation wave signal. The output of modulator 43 (i.e., the amplitude-modulated signal) is amplified by amplifier 44 and then supplied to deflector 45. The output signal of deflector 45, whose waveform is shown in FIG. 7, is supplied to deflection electrodes 38. Electrodes 38 are driven by the output signal of deflector 45, which has been obtained by amplitude-modulating the high-frequency voltage signal by the lower-frequency signal. It therefore deflects the beam rapidly in the Y direction, thus a straight locus of the beam spot, having a relatively uniform intensity distribution, is formed on the surface of sample 34. While electrodes 38 are rapidly deflecting the electron beam in the Y direction, scanning coil unit 35 deflects the beam in the X direction along the first scanning line. Hence, the electron beam, that is, the pseudo-line-shaped beam scans a rectangular surface region of sample 34, whose width is equal to the length of the locus of the beam spot. When the beam spot reaches the end of the first scanning region, the linear locus of the spot is moved in the Y direction to the start of the second scanning region. Then, sample 34 is scanned along the second scanning line. The scanning is repeated until the entire surface of sample 34 is scanned, whereby a semiconductor, single crystal layer is formed on the entire surface of sample 34.

In the electron beam annealing apparatus of FIG. 5, the intensity distribution of the straight locus of the beam spot can be changed by controlling the amplitude A of the fundamental wave signal and the amplitude B of the modulation wave signal. The waveform of the modulation wave signal is given:

$$Y = (A \sin \omega_1 t + B) \sin \omega_2 t \quad (1)$$

where t is time, $\omega_1$ is the frequency of the modulation wave signal, and $\omega_2$ is the frequency of the fundamental wave signal. A/B represents the degree m of the amplitude modulation. FIG. 8 is a graph showing how the electron beam density of a point on the surface of sample 24 or the probability for the beam spot to stay at the point on the surface of sample 24 varies with degree m. The distance between such a beam spot and the middle point of the straight locus of the beam spot, the unit of which is B, is plotted along the X axis, and said probability is plotted along the Y axis. As FIG. 8 shows, when m=0, that is, when the fundamental wave signal is not amplitude-modulated at all, the maximum probability is observed at the distance of 1 (=B) and gradually decreases toward the middle point of the locus of the beam spot. With this probability distribution, the surface temperature distribution of FIG. 3 on the sample 24 is assumed. As shown in FIG. 3, the surface temperature of sample 34 decreases at the end portions of the straight locus of the beam spot. This is because more heat radiates from the edges of sample 34 than from the center portion thereof.

As evident from FIG. 8, as m is increased to 0.2 and then to 0.5, the maximum probability decreases, and the difference between this maximum probability and the probability observed at the middle point of the straight locus also decreases. As this difference decreases, the surface temperature distribution of sample 34 becomes more uniform due to the heat radiation from the edges of sample 34. When the maximum probability subsequently decreases, the temperature gradient from the annealed region to the peripheral region of sample 34 is reduced. Therefore, the surface temperature distribution shown in FIG. 3 can be rendered uniform by selecting an optimum value for m, whereby that portion of the polycrystalline or amorphous silicon layer of sample 34, which has been illuminated with the electron beam, is evenly melted. The preferred value for m ranges from about 0.2 to about 0.8. The optimum value is determined by the structure of sample 34, the ambient temperature, etc.

When m>0 and the modulation wave signal has a sufficient high frequency, the maximum probability or electron density is observed at the distance of more than 1 from the middle point of the straight locus of the beam spot. The inventors hereof have conducted experiments. The results of the experiments showed that the relationship (FIG. 7) between m and said probability, on the one hand, and the distance between the beam spot and the middle point of the locus of the beam spot, on the other hand, could be obtained only if the modulation wave signal has one or more peaks every time the beam spot moves in the X direction for the distance equal to its diameter. The results also revealed that the surface temperature distribution of sample 34 was sufficiently uniform when the modulation wave signal has at least ten peaks every time the beam spot moves in the X direction for said distance. The frequency of the modulating wave signal must therefore satisfy the following relation:

$$F (b/v) \geq 1 \quad (2)$$

where d is the diameter of the beam spot and v is the scanning rate.

In the first embodiment of this invention, the values for b [mm], v [mm/sec] and F [Hz] are selected, thus satisfying relation (2).

Methods of forming a semiconductor, single crystal layer on an insulative substrate, by using the apparatus of FIG. 5, will now be described by way of examples.

EXAMPLE 1

First oscillator 41 generated a sine wave signal (i.e., a reference wave signal) of 50 MHz. Second oscillator 42 generated a sine wave signal (i.e., a modulation wave signal) of 10 KHz. These sine signals had amplitudes of 60 V and 20 V, respectively. In modulator 43, the 50 MHz signal was amplitude-modulated by the 10 KHz signal. The modulated signal, i.e., the output signal of modulator 43 was supplied to deflector 45. The output signal deflector 45 was supplied to deflection electrodes 38. A current of 12 m A was supplied to electron gun 31, which emitted an electron beam. When the beam was applied onto sample 34, it formed a spot having a diameter of about 150 μm. The sample was scanned with this beam at the rate of 100 mm/sec. Hence:

$$F(b/v) = 10 \times 10^3 0.15/100 = 15$$

Figure 9A:
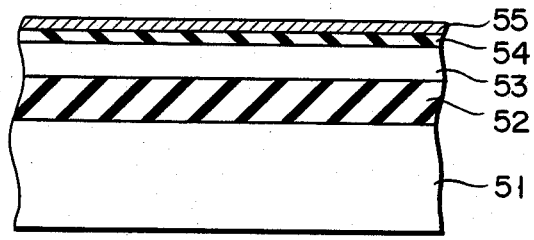
FIG. 9A and FIG. 9B are cross-sectional views of samples of different structures which are annealed by the apparatus of FIG. 5.

This means that the modulation wave signal had 15 peaks every time the beam spot moves in the X direction for the distance of 15 μm, i.e., the diameter of the beam spot. Obviously, this satisfies relation (2). As shown in FIG. 9A, sample 34 consisted of a single crystal silicon disk 51 having crystal plane (100) and a diameter of 5 inches, a silicon oxide (insulative) layer 52 deposited on silicon disk 51, a polycrystalline silicon (semiconductor) layer 53 deposited on layer 52, a tungsten (gap) layer 54 formed on layer 53, and a silicon nitride layer 55 formed on tungsten layer 54. Layers 52, 53, 54 and 55 had thicknesses of 1.3 μm, 0.6 μm, 1.0 μm and 0.2 μm, respectively.

After the scanning, a rectangular portion of polycrystalline silicon layer 53, which had a width of 5 mm, was recrystallized, forming a single crystal silicon layer. This recrystallized silicon layer had a very flat surface.

Figure 9B:
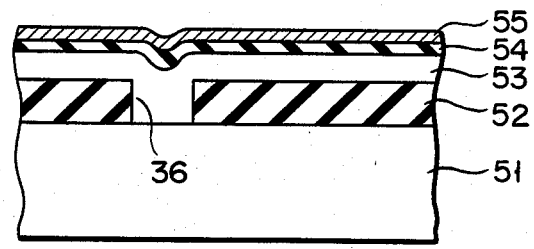

Another sample was also scanned in the same manner as described above. As shown in FIG. 9B, this sample is identical with sample 34, except that silicon oxide layer 52 had a through hole and that this hole was filled up with polycrystalline silicon. After the scanning, a single crystal epitaxially grew first in the through hole of layer 52, upwardly from silicon disk 51, and then horizontally in polycrystalline silicon layer 53. As a result, a rectangular, single crystal silicon layer having a width of 5 mm and a crystal plane (100) was formed.

EXAMPLE 2

Figure 10:
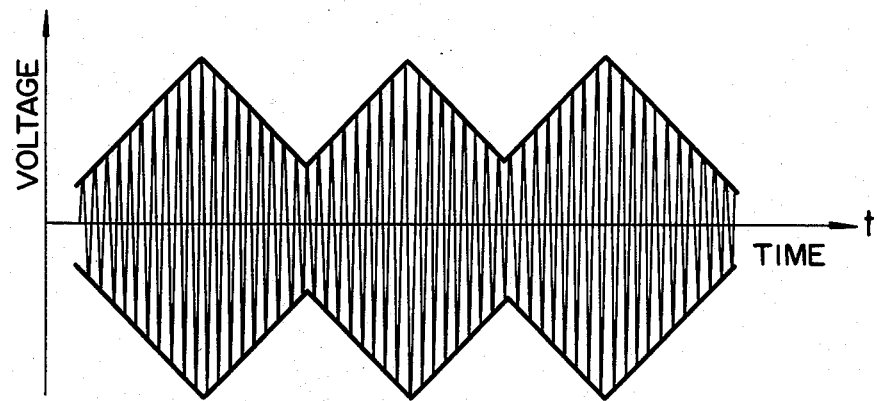
FIG. 10 shows the waveform of a deflection signal generated by modulating the amplitude of a fundamental wave signal with a modulation wave signal having a triangular waveform.

A triangular wave voltage was used as the modulation wave signal. Subsequently, such a deflection signal as is shown in FIG. 10 was supplied to deflector 45. The same sample as was used in Example 1 was scanned under the same conditions as in Example 1. As a result, a rectangular layer of recrystallized single crystal silicon, having a width of 4.8 mm, was formed. This layer had a sufficiently flat surface.

EXAMPLE 3

Figure 11:
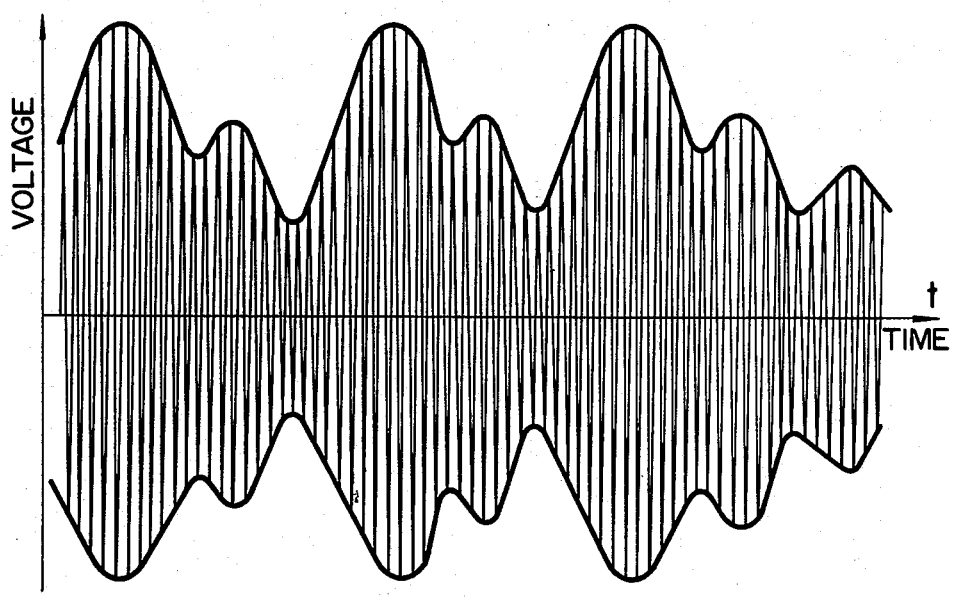
FIG. 11 shows the waveform of a deflection signal generated by modulating the amplitude of a fundamental wave signal with two sine wave signals.

A sine wave signal having an amplitude of 15 V and a frequency of 7.6 KHz and a sine wave signal having an amplitude of 20 V and a frequency of 10 KHz were superposed, thus forming a modulation wave signal. A reference wave signal having a frequency of 50 MHz was modulated by this modulation wave signal. Then, such a deflection wave signal as is shown in FIG. 11 was produced. This deflection wave was used, thus scanning the same sample under the same conditions as in Example 1. As a result, a rectangular layer of recrystallized single crystal silicon, having a width of 5.5 mm, was formed. This layer had a very flat surface and was found to have a uniform composition. However, many crystal defects were found in some peripheral regions of this layer.

Figure 12:
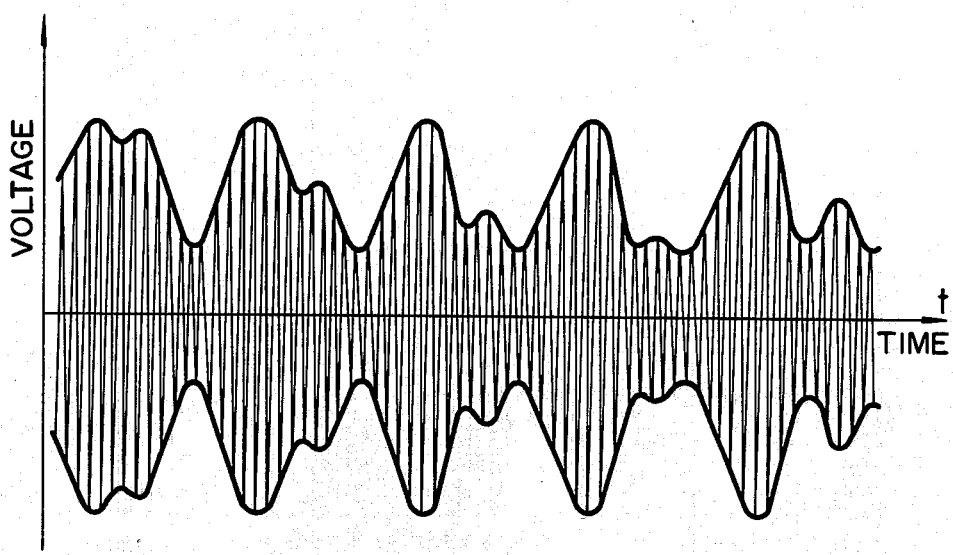
FIG. 12 shows the waveform of a deflection signal generated by modulating the amplitude of a fundamental wave signal with two sine wave signals whose phases have been controlled.
Figure 13:
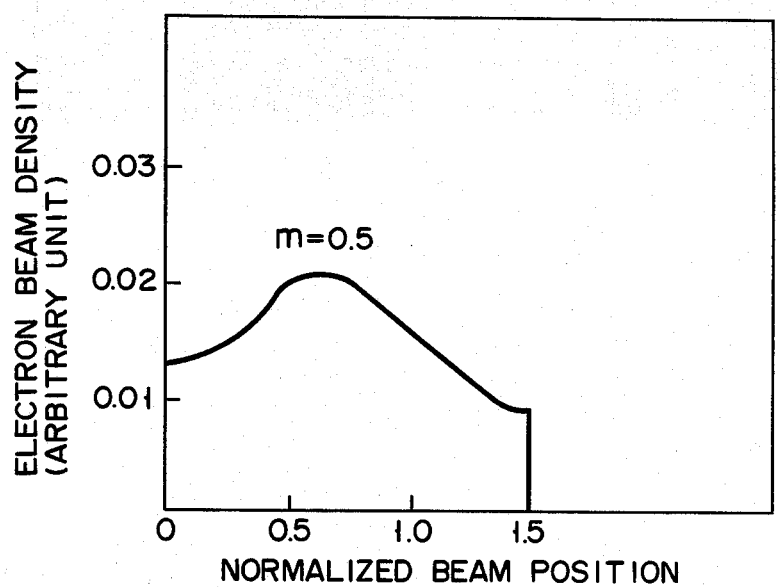
FIG. 13 shows how the probability for the beam spot to stay at any point varied along the locus of the beam spot when the degree of amplitude modulation is 0.5.

Various attempts were made to form a layer of recrystallized single crystal silicon without such peripheral regions. When the two sine wave signals were phase-shifted by π/16 and superposed on one another, such a deflection wave signal as is shown in FIG. 12 was generated. As shown in FIG. 12, the height of the peak resulting from the 15 V sine wave signal periodically changed. As a result, the probability for the beam spot to momentarily stay at any point varied along the locus of the beam spot when m = 0.5, as illustrated in FIG. 13. As FIG. 13 indicates, the maximum probability is very low, and the probability varies only slightly along the straight locus of the beam spot. The deflection wave signal of FIG. 12 was supplied to deflector 45, and the same sample is scanned in the same manner as in Example 1. Then, a rectangular layer of recrystallized single crystal silicon, having a width of 6.0 mm, was formed. This layer was not only broad, but had a sufficiently flat surface, a very uniform composition and an excellent crystallinity.

EXAMPLE 4

Figure 14A:
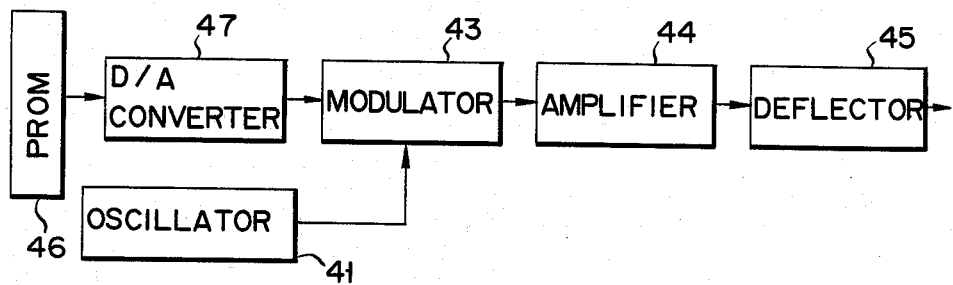
FIG. 14A is a block diagram of another circuit for supplying a high-frequency deflection wave signal to the apparatus of FIG. 5.

Instead of the analog modulation described above, the more advanced pulse code modulation (PCM) was employed. Further, such a semiconductor memory (PROM) 46 and a D/A converter 47 (both shown in FIG. 14A) were used in place of second oscillator 42 (FIG. 6). In the apparatus shown in FIG. 14A, a signal of any waveform can be used as the modulation wave signal. The waveform of the modulation wave signal was quantized, and the resultant quantized waveform was converted into binary data. These binary data was stored in memory 46. The binary or digital data was read from memory 46 and supplied to D/A converter 47. D/A converter 47 converted the digital data into analog data, which had been supplied to modulator 43.

Figure 14B:
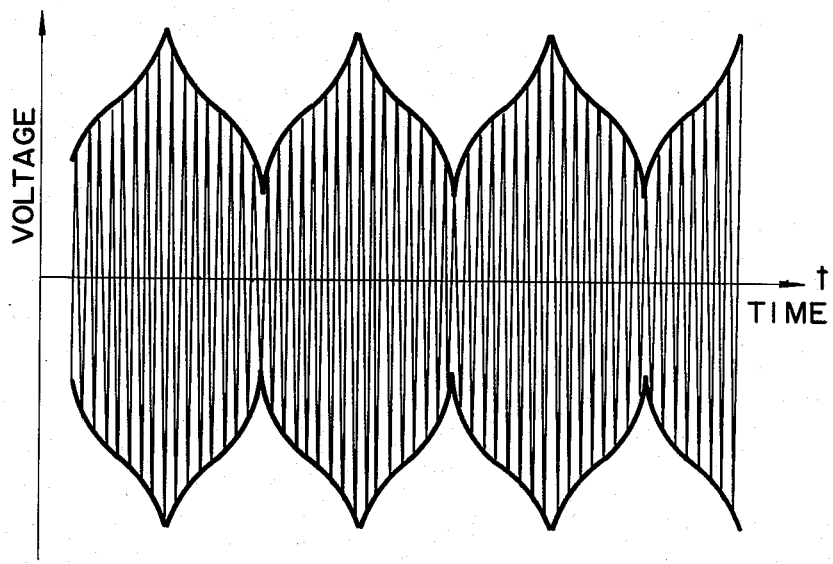
FIG. 14B shows the waveform of a deflection signal generated by modulating a fundamental wave signal with a Caspu wave modulation signal.

Modulator 43 modulated the fundamental wave signal by this analog data. The output signal of modulator 43 was amplified by amplifier 44 and then supplied to deflector 45. The output signal of the deflector, whose waveform is shown in FIG. 14B, was supplied to deflection electrodes 38. Electrodes 38 rapidly deflected the electron beam in the Y direction, and the beam spot drew a straight locus on sample 34. The electron beam density or the probability for the beam spot to stay on the surface of sample 34 was controlled and appropriately distributed along the locus of the beam. Hence, the surface temperature distribution of sample 34 was completely uniform along the straight locus of the beam spot. Example 4 is therefore advantageous over Examples 1-3 in which said probability cannot be uniform along the locus of the beam spot unless the modulation wave signal with a specific waveform is used to generate a signal for driving deflection electrodes 38.

EXAMPLE 5

A computer (CPU) 48 was used in place of memory (PROM) 46 used in Example 4, as illustrated in FIG. 15A. More specifically, the computer produced a signal with any waveform. The signal was supplied to a D/A converter as the modulation wave signal. The output digital data of the D/A converter was used to modulate the amplitude of a fundamental wave signal. The waveform of the output signal from deflector 45 could be changed in accordance with the optimum annealing conditions during the beam annealing, i.e., the forming of a semiconductor single crystal layer. That is, as shown in FIG. 15B, a noncontacting temperature sensor 49 monitored the surface temperature of a sample at all times during the electron beam annealing. From the changes in the output of sensor 49, CPU 48 calculated the optimum value for the distribution of the probability for the electron beam spot to stay at any point on the sample. In accordance with the calculated distribution of this probability, the CPU produced a modulation wave signal of a different waveform.

This method is advantageous in two aspects. First, the edge portion of the annealed region of the sample can be maintained at the same surface temperature as the center portion, despite the heat dissipation from the edge portions. Secondly, an excessive heating of that portion of the sample which is illuminated by the electron beam twice during the raster scanning can be prevented. These advantageous features cooperate to form a single crystal layer of uniform composition and thickness.

FIG. 16 shows the waveform of a deflection wave signal which CPU 48 has produced by combining linear functions. When the output of temperature sensor 49 was less than a predetermined value, the slopes of the linear functions were made to be gentle. Conversely, when the output of temperature sensor 49 was greater than a predetermined value, the slopes of the linear functions were made to be steep. Consequently, the waveform of the deflection wave signal is represented by a number of short straight lines.

FIG. 17 shows the waveform of a deflection wave signal which CPU 48 has produced by combining quadratic functions. In this case, the waveform of the deflection wave signal was represented by a number of short curves. The deflection wave signal of this waveform could make the distribution of the probability more uniform along the straight locus of the beam spot.

The present invention is not limited to Examples 1-5. For example, the fundamental wave signal may have a frequency other than 50 MHz. Any fundamental wave signal that helps to reduce the variation of the surface temperature of the sample in the Y direction may be used. To decrease this variation, it is desired that the fundamental wave signal has a frequency of 50 MHz or more. Further, the modulation wave signal may have a frequency other than 10 KHz. Any signal having a frequency lower than that of the reference wave signal can be utilized. Moreover, the deflection of the electron beam is not limited to the electrostatic one. An electromagnetic field may be applied to deflect the electron beam.

EXAMPLE 6

The circuit shown in FIG. 35 was used to generate a deflection signal having such a waveform as is shown in FIG. 36. The circuit comprised two oscillators 41 and 42, a mixer 90, an amplifier 44 and a deflector 45. First oscillator 41 generated a sine wave deflection signal having a frequency of 50 MHz. Second oscillator 42 generated a sine wave deflection signal having a frequency of 1 Hz. Both deflection signals had the same amplitude of 60 V. They were supplied to mixer 90. Mixer 90 added these input signals, generating an output signal. The output signal of mixer 90 was amplified by amplifier 44 and then supplied to deflector 45. The deflection signal generated from the deflector 45 was supplied to deflection electrodes 38 (FIG. 5). A current of 4.8 mA was supplied to electron gun 31, which emitted an electron beam. This beam was accelerated by an acceleration voltage of 10 KeV, and scanned a sample at a rate of 100 m/sec. The sample consisted of a single crystal silicon disk having crystal plane (100) and a diameter of 5 inches, a silicon oxide (insulative) layer deposited on the silicon disk and having a thickness of 1 $\mu$m, and a polycrystalline silicon (semiconductor) layer deposited on the insulative layer and having a thickness of 0.6 $\mu$m.

Figure 18:
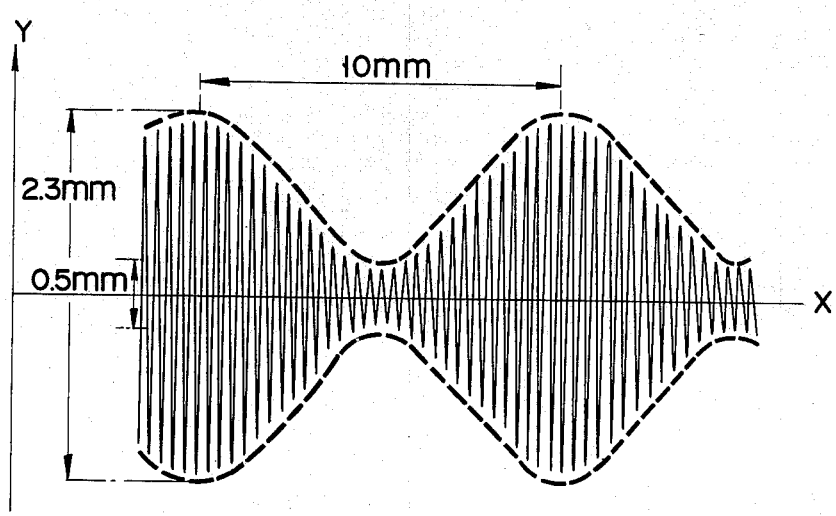
FIG. 18 shows that region of the sample which has been scanned and annealed with an electron beam rapidly deflected by a deflection signal generated by amplitude-modulating a fundamental wave signal with a modulation wave signal of a relatively low frequency.

After the scanning, the region of the sample shown in FIG. 18 was melted. The maximum width of this region was 1.9 mm, and the minimum width thereof was 0.5 mm. The beam current was selected such that the polycrystalline silicon layer might be properly melted at the broadest portions. If the ratio of the minimum width to the maximum width is changed, the number of crystal defects per unit area in the portions of the narrowest portions may change. This method is equivalent to the so-called "necking process" conducted in the drawing method or floating method for forming single crystal ingots.

In Example 6, crystal defects were made in the edge portions of the annealed region. However, the forming of crystal defects in the center portion of the region was suppressed.

In Example 6, two sine wave signals were used to generate the deflection signal. One of these signals was replaced by one having a triangular waveform, one having a polygonal waveform and one having a sawtooth waveform. The results were similar to those described in the preceding paragraph.

Figure 19:
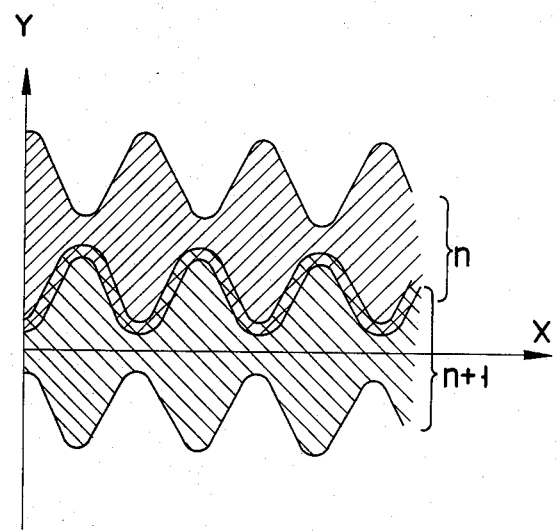
FIG. 19 shows the region of the sample which has been annealed by applying two electron beams overlapping on the surface of the sample.

In order to scan the sample along the next scanning line after annealing the region shown in FIG. 18, the locus of the beam spot must be moved in the Y direction. Further, some measures must be taken to anneal a new region such that the broadest portions of this region partly overlap the narrowest portions of the annealed region as illustrated in FIG. 19. This is achieved by shifting the phase of the deflection signal by 180° with respect to that of the deflection signal used in forming the first annealed region. As shown in FIG. 19, the waving, lapping portion of the annealed regions has the same width over its entire length. This width is determined by the angle at which the electron beam is deflected in the Y direction.

Moreover, another pair of deflection electrodes which are formed into curved shape may be used in addition to deflection electrodes 38 shown in FIG. 5. When this pair of electrodes is energized with a deflection signal of a specified voltage, they work together with electrodes 38, thereby deflecting the electron beam in such a way that an arcuate locus of the beam spot, bulging in the scanning direction, is formed on the sample. As the specified region of the sample is scanned while these electrodes are rapidly deflecting the beam, the annealing proceeds from the center portion of the region toward the lateral edges of the region. This method suppresses the forming of crystal defects more than the beam is rapidly deflected by only electrodes 38, forming a straight locus of the beam spot on the sample.

Second Embodiemnt

In the first embodiment of the invention, a sine wave signal, whose waveform is symmetrical with respect to the reference potential, was used as the modulation wave signal, thus generating the deflection wave signal shown in FIG. 6. Due to the use of this deflection wave signal, the probability for the beam spot to stay at any point on the sample is much higher at a specific point than other points as illustrated in FIG. 7. This is the main factor that prevents the surface temperature from being distributed evenly over the entire annealed region of the sample.

Figure 22:
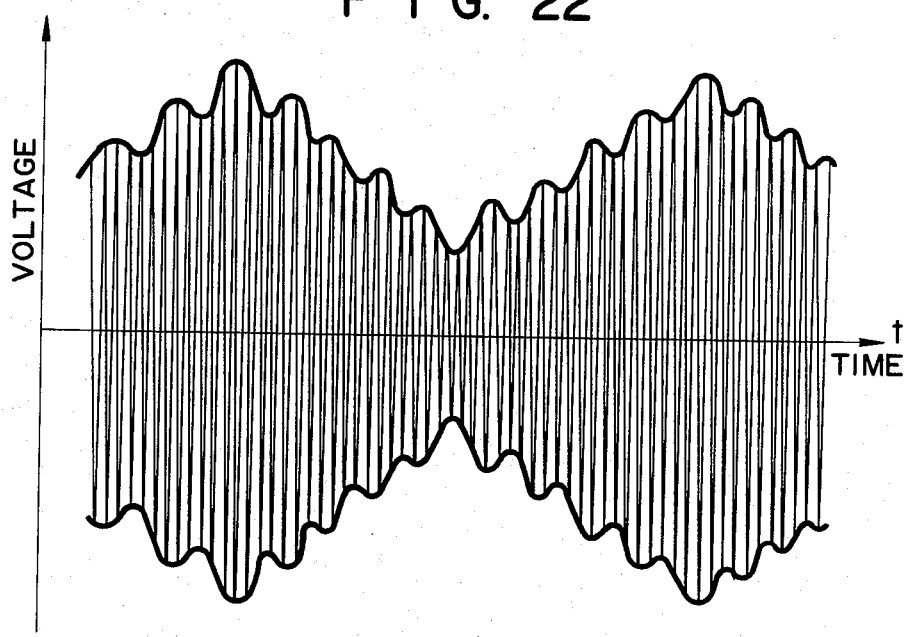
FIG. 22 shows the waveform of a deflection signal generated by amplitude-modulating a high-frequency fundamental signal with the modulation wave signal shown in FIG. 21C.

Therefore, in the second embodiment, the electron beam is rapidly deflected in the Y direction by such a deflection signal as is shown in FIG. 22. This electric signal has been obtained by modulating the amplitude of a modulation wave signal and then the amplitude of fundamental wave signal by the amplitude-modulated signal. As a result, said probability is high at several points, and these peak values are smaller than the single peak value observed in Examples 1-6. The surface temperature of the sample can therefore be controlled more accurately than in the first embodiment.

The second embodiment will now be described by way of a few examples.

EXAMPLE 7

Figure 20:
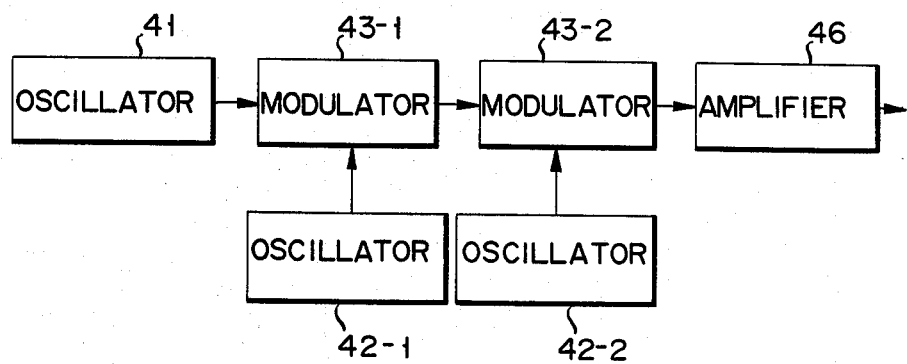
FIG. 20 is a block diagram of a circuit for generating a deflection signal by amplitude-modulating a high-frequency fundamental wave signal with two modulation wave signals of different frequencies.
Figure 21A:
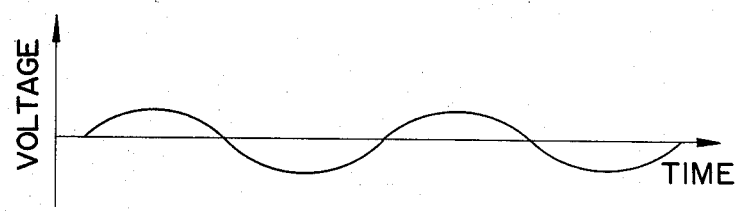
FIGS. 21A and 21B show the waveforms of the first and second modulation wave signals of different frequencies used in the circuit of FIG. 20.
Figure 21B:
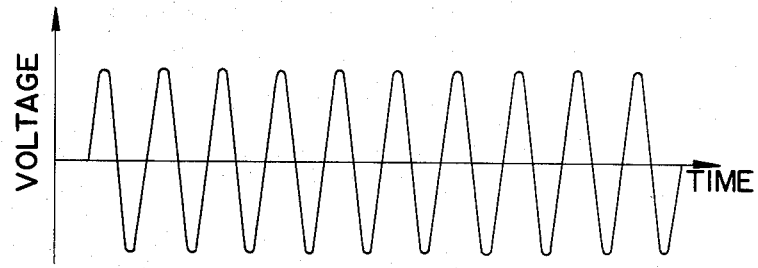
Figure 21C:
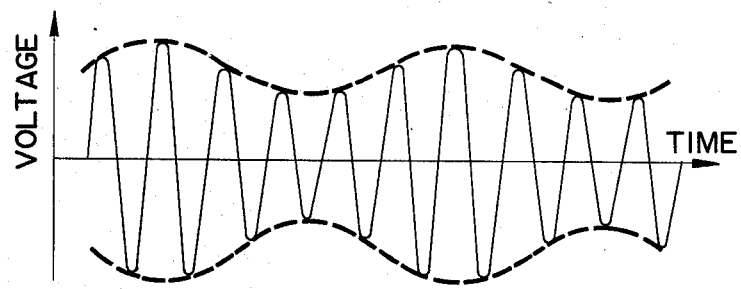
FIG. 21C shows the waveform of a signal generated by synthesizing the first and second modulation wave signals shown in FIGS. 21A and 21B.

FIG. 20 schematically shows the high-frequency deflection signal generator used in Example 7. This generator comprised three oscillators 41-1, 41-2 and 42, two modulators 43-1 and 43-2, an amplifier 46 and a deflector 46. First oscillator 41-1 generates a first modulation wave signal having the waveform shown in FIG. 21A. Second oscillator 42-2 generates a second modulation wave signal having the waveform shown in FIG. 21B. The first and second modulation wave signals are supplied to first modulator 43-1. First modulator 43-1 modulates the amplitude of the first modulation wave signal with the second modulation wave signal, thereby generating a modulated wave signal having the waveform shown in FIG. 21C. Third oscillator 42 generates a fundamental wave signal having a frequency higher than that of the output wave signal of second modulator 43-2, and supplies the fundamental wave signal to second modulator 43. Second modulator 43 modulates the amplitude of the fundamental wave signal with the output signal of second modulator 43-2, thus outputting the deflection signal having the waveform shown in FIG. 22. This electric signal is amplified by amplifier 44 and then supplied to a deflector 45 (not shown).

First oscillator 41-1 generated a first modulation wave signal having a frequency of 5 KHz and an amplitude of 5 V, second oscillator 42-2 generated a second reference wave signal having a frequency of 26 KHz and an amplitude of 15 V, and third oscillator 42-2 generated a fundamental wave signal having a frequency of 50 KHz and an amplitude of 40 V. First modulator 43-1 modulated the amplitude of the first modulation wave signals with the second modulation wave signal. The amplitude of the second modulation wave signal was then modulated with the output signal of first modulator 43-1 by second modulator 43-1. As a result, a deflection signal having the waveform of FIG. 22 and a frequency of 50 MHz was obtained. This electric signal was supplied to deflection electrodes 38.

Electrodes 38 rapidly deflected an electron beam having a diameter of 150 μm in the Y direction, thereby forming a straight locus having a length of 4 mm on the surface of a sample. The beam scanned the sample, using a beam acceleration voltage of 12 KV, a beam current of 12 mA, at the rate of 100 m/sec. The sample had the same structure as shown in FIG. 9A. It consisted of a single crystal silicon disk 51 having crystal plane (100) and a diameter of 5 inches, a silicon oxide (insulative) layer 52 deposited on silicon disk 51, a polycrystalline silicon (semiconductor) layer 53 deposited on layer 52, a tungsten (gap) layer 54 formed on layer 53, and a silicon nitride layer 55 formed on tungsten layer 54. Layers 52, 53, 54 and 55 had thicknesses of 1.3 μm, 0.6 μm, 0.5 μm and 0.5 μm, respectively.

After the scanning, a rectangular portion of polycrystalline silicon layer 53, which had a width of 3.7 mm, was recrystallized, forming a single crystal silicon layer. This recrystallized silicon layer had a very flat surface. Another sample was also scanned in the same manner as described above. As shown in FIG. 9B, this sample is identical with sample 34, except that silicon oxide layer 52 had a through hole and that this hole was filled up with polycrystalline silicon. After the scanning, a single crystal epitaxially grew first in the through hole of layer 52, upwardly from silicon disk 51, and then horizontally in polycrystalline silicon layer 53. As a result, a rectangular, single crystal silicon layer having a width of 3.7 mm and a crystal plane (100) was formed.

In Example 7, two sine wave signals were used to generate the deflection signal. One of these signals was replaced by one having a triangular waveform, one having a polygonal waveform and one having a sawtooth waveform. The results were similar to those described in the preceding paragraph.

Moreover, the pulse modulation may be applied in Example 6, and a computer (CPU) may be used to generate a digital waveform signal. In this case, the digital signal is converted into an analog signal by a D/A converter, and the resultant analog signal is amplitude-modulated.

Third Embodiment

In the first embodiment, a sine wave signal, whose waveform is symmetrical with respect to the reference potential as shown in FIG. 6, was used as the modulation wave signal. In Example 7, such a modulation wave signal as is shown in FIG. 23C, whose waveform is asymmetrical with respect to the reference potential, was used in order to more accurately control the surface temperature distribution on the entire annealed region of the sample. In other words, a fundamental wave signal was amplitude-modulated with the modulation wave signal of FIG. 23C whose waveform is asymmetrical with respect to the reference potential.

Figure 23:
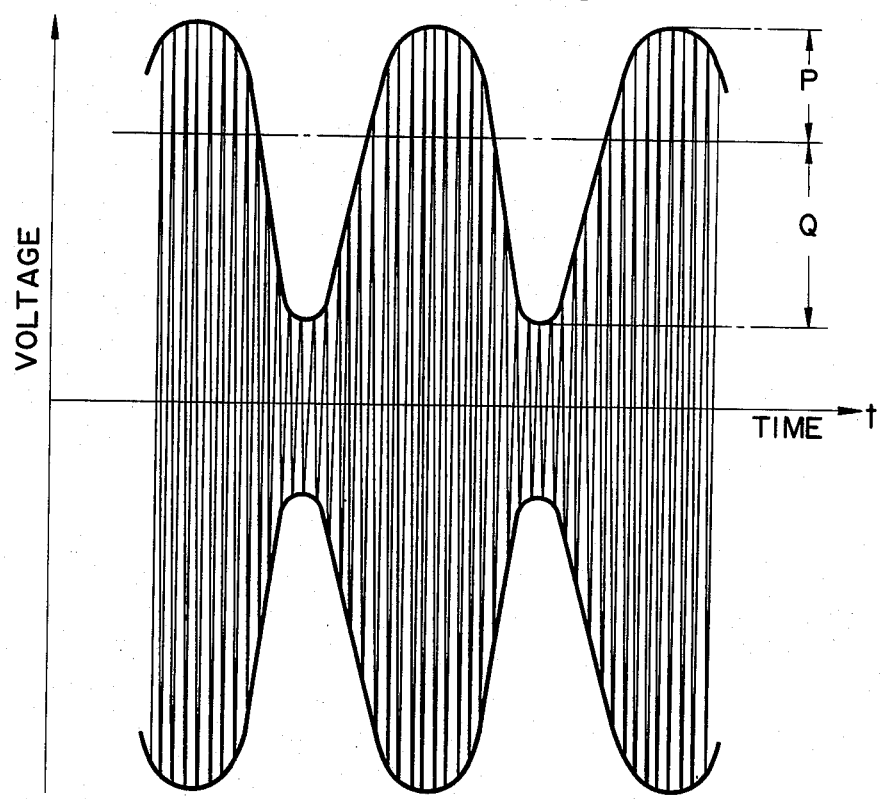
FIG. 23 shows the waveform of a deflection signal generated by amplitude-modulating a high-frequency reference signal with a sine wave modulation signal whose waveform is asymmetrical with respect to the reference potential.
Figure 24:
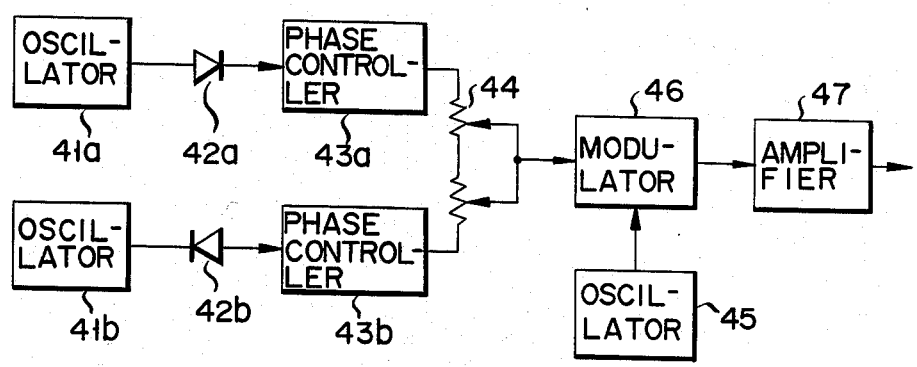
FIG. 24 is a block diagram of a circuit for generating the deflection signal shown in FIG. 23.
Figure 25A:
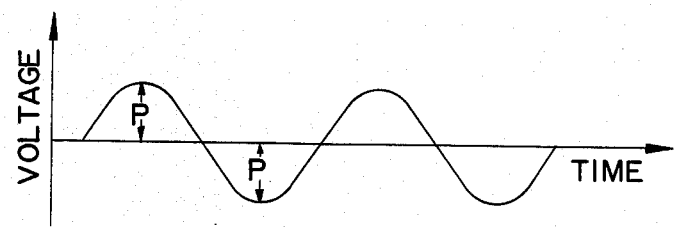
FIGS. 25A and 25B show the waveforms of the first and second modulation wave signals used in the circuit of FIG. 24.
Figure 25B:
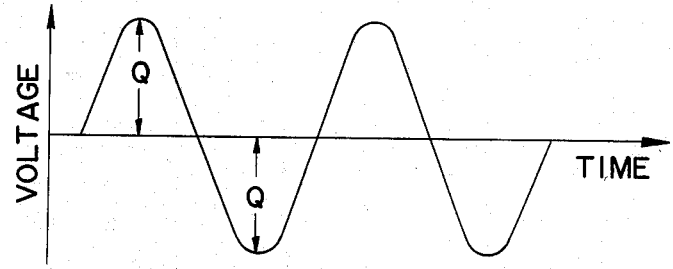
Figure 25C:
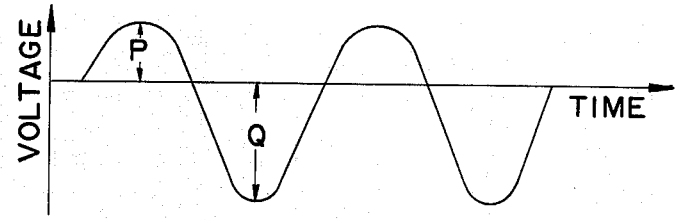
FIG. 25C shows the waveform of a modulation wave signal generated by synthesizing the first and second modulation wave signals shown in FIGS. 25A and 25B.

FIG. 24 schematically shows the high-frequency deflection signal generator used in Example 8. This generator comprises two oscillators 41a and 41b, two diodes 42a and 42b, two phase controller 43a and 43b, a waveform synthesizer 44, an oscillator 45, a modulator 46 and an amplifier 47. Both oscillators 41a and 41b generate sine wave signals having the same frequency and different amplitudes P and Q as shown in FIG. 25A and 25B. Oscillator 45 generates a fundamental wave signal. The output signal of oscillator 41a is supplied to phase controller 43a through diode 42a. Similarly, the output signal of oscillator 41b is supplied to phase controller 43b through diode 42b. The output signals phase controllers 43a and 43b are input to a waveform synthesizer 44. The output signal of this synthesizer, i.e., a modulation signal having the waveform shown in FIG. 23C, is supplied to modulator 46. The output signal of oscillator 45 is also supplied to modulator 45. The output signal of modulator 46 is amplified by amplifier 47. The output signal of amplifier 47, i.e., the deflection signal of FIG. 23, is supplied to deflection electrodes 38 (FIG. 5).

The values of P and Q determine the asymmetry and amplitude of the deflection wave signal. The surface temperatures of the edge portions of the annealed region can be effectively controlled by changing P. In other words, the value for P is selected to obtain an optimum temperature distribution over the surface of the sample.

EXAMPLE 8

Oscillators 41a and 41b generated sine wave signals having the same frequency of 15 KHz and different amplitudes of 8 V and 14 V. Oscillator 45 generated a fundamental wave signal having a frequency of 50 MHz and an amplitude of 60 V. The output signals of oscillator 41a and 41b were supplied to phase controller 43a through diodes 42a and 42b. The output signals phase controllers 43a and 43b are input to a waveform synthesizer 44, the output signal of which is supplied to modulator 46. The fundamental wave signal from oscillator 45 was supplied to modulator 46. Modulator 46 modulated the amplitude of the fundamental wave signal with the output signal of waveform synthesizer 44. The amplitude-modulated signal was amplified by the amplifier 47, thus generating the deflection signal shown in FIG. 23. This deflecting signal was supplied to deflection electrode 38.

Electrode 38 rapidly deflected an electron beam having a diameter of 150 μm in the Y direction, thereform forming a straight locus having a length of 4 mm on the surface of a sample. The beam scanned the sample, using a beam current of 12 mA, a beam acceleration voltage of 12 KV, at the speed of 100 mm/sec. The sample has the same structure as shown in FIG. 9A. It consisted of a single crystal silicon disk 51 having a crystal plane (100) and a diameter of 5 inches, a silicon oxide (insulative) layer 52 deposited on disk 51, a polycrystalline silicon (semiconductor) layer 53 deposited on layer 52, a tungsten (gap) layer 54 formed on layer 53, and a silicon nitride layer 55 formed on tungsten layer 54. Layers 52, 53, 54 and 55 had thicknesses of 1.3 μm, 0.6 μm, 0.5 μm and 0.5 μm, respectively.

After the scanning, a rectangular portion of polycrystalline silicon layer 53, which had a width of 3.5 mm, was recrystallized, forming a single crystal silicon layer. This recrystallized layer had a very flat surface. Another sample was also scanned in the same manner as described above. As shown in FIG. 9B, this sample is identical with the sample of FIG. 9A, except that silicon oxide layer 52 had a through hole filled up with polycrystalline silicon. After the scanning, a single crystal epitaxially grew first in the through hole of layer 52, upwardly from silicon disk 51, and then horizontally in polycrystalline silicon layer 53. As a result, a rectangular, single crystal silicon layer having a width of 3.5 mm and a crystal plane (100) was formed.

In Example 8, two sine wave signals were used to generate the deflection signal. One of these signals was replaced by triangular wave signals, polygonal wave signals and saw-tooth wave signals. The results were similar to those described in the preceding paragraph.

EXAMPLE 9

Figure 26:
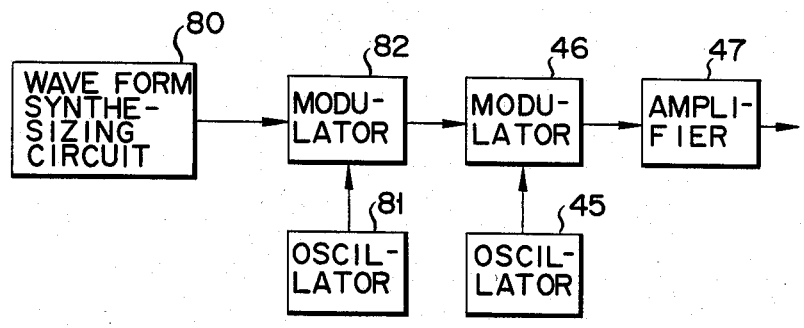
FIG. 26 is a block diagram of a circuit for generating a deflection signal by synthesizing a first modulation wave signal having a waveform asymmetrical with respect to the reference potential and a second modulation wave signal having a frequency different from that of the first modulation wave signal.
Figure 27:
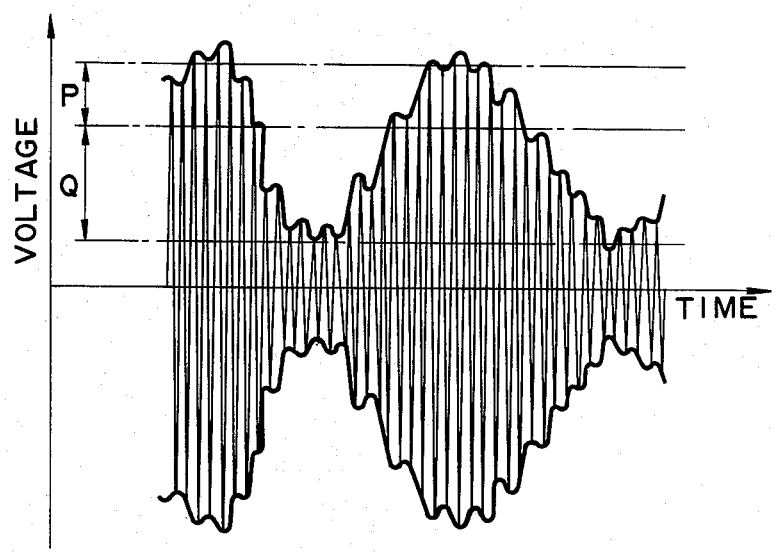
FIG. 27 shows the waveform of the modulation wave signal generated by the circuit of FIG. 26.

A circuit for generating a high-frequency deflection signal was used. As shown in FIG. 26, this circuit comprised a waveform synthesizer circuit 80, two oscillators 81 and 45, two modulators 82 and 46, and an amplifier. Waveform synthesizer circuit 80 included an oscillator, a diode, a phase controller 43 and a waveform synthesizer. Circuit 80 generated an output signal, which was supplied to modulator 82. A fundmanetal wave signal having a frequency of 100 KHz was also supplied to modulator 82 from oscillator 81. Modulator 82 modulated the amplitude of this fundamental wave signal with the output signal of circuit 80, thereby generating an output signal. This signal is supplied to modulator 46. A fundamental wave signal was also supplied to modulator 46 from oscillator 45. Modulator 46 modulated the amplitude of the signal output by oscillator 45 with the output signal of modulator 82, thus generating an output signal. The output signal of modulator 46 was amplified by amplifier 47. The output signal of amplifier 47 was supplied to a deflector (not shown). The deflector generated a deflection signal whose waveform is shown in FIG. 27. Using this deflection signal, the same samples as shown in FIGS. 9A and 9B were annealed in the same method as in Example 8. As a result, a single crystal silicon layer having a width of 4.5 mm was formed. This layer had an even composition and a flat surface. Its crystallinity was excellent.

In Example 9, two sine wave signals were used to generate the deflection signal (FIG. 27). One or both of these signals were replaced by triangular wave signals, polygonal wave signals and saw-tooth wave signals. The results were similar to those described in the preceding paragraph.

Fourth Embodiment

When the deflection signal shown in FIG. 7 is used, thus rapidly deflecting an electron beam in the Y direction and forming a straight locus of a beam spot on a sample in order to anneal a region of the sample, the distribution of probability of the beam spot staying at any point on the sample depends on the degree of the amplitude modulation, m. It follows that an even distribution of said probability can be achieved if use is made of a deflection signal having an appropriate waveform. A uniform distribution of the probability along the straight locus of the beam spot makes it possible to accurately control the surface temperature of the specified region of the sample. The results of the experiments repeated by the inventors hereof showed that the distribution of said probability can be made uniform when two measures are taken. First, a fundamental wave signal is amplitude-modulated with a modulation wave signal represented by a series of combinations of a curve ($y=t^{1/n}$) and a horizontal straight line and a curve ($y=-(a-t)^{1/n}$), whereby $n \geq 2$ is established and a is constant. Secondly, the deflection signal obtained by this amplitude modulation is supplied to deflection electrodes 38, thereby rapidly deflecting an electron beam in the Y direction and scanning the sample. A few examples falling within the scope of the fourth embodiment will now be described.

EXAMPLE 10

Figure 28:
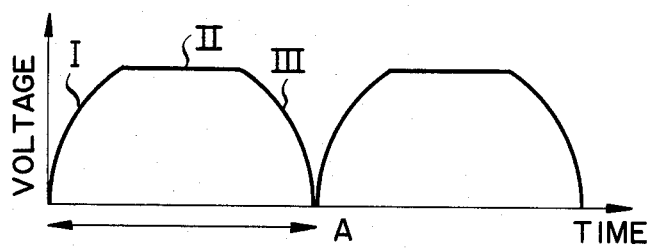
FIG. 28 shows the waveform of a modulation wave signal.

Use was made of a modulation wave signal of 10 KHz. This signal had such a waveform as is shown in FIG. 28. Each wave of the signal is a combination of a curve I represented by the function $y=t^{\frac{1}{2}}$, a horizontal straight line II, and a curve III represented by the function $y=(a-t)^{\frac{1}{2}}$. The ratio of the period occupied by both curves I and III to the period occupied by line II is 10:4. Such a modulation wave signal can be generated by PROM 46 (FIG. 14A) or CUP 48 (FIG. 15A).

Figure 29:
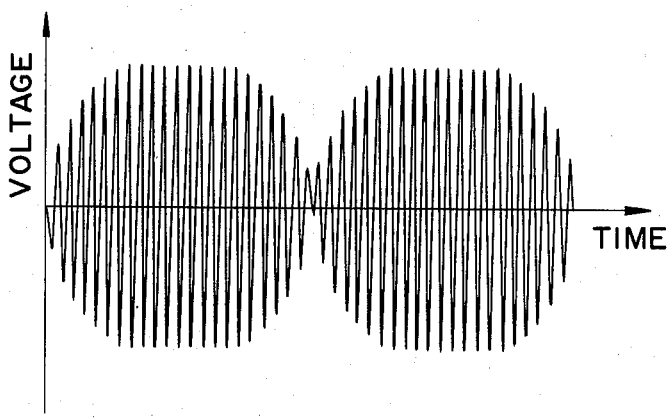
FIG. 29 illustrates the waveform of a deflection signal obtained by amplitude-modulating a high-frequency fundamental signal with the modulation wave signal shown in FIG. 28.

A fundamental wave signal of 50 MHz was amplitude-modulated by the modulation wave signal shown in FIG. 28, thereby obtaining a deflection signal having such a waveform as is shown in FIG. 29 and having an amplitude of 50 V. This deflection signal was supplied to deflection electrodes 38. Electrodes 38 rapidly deflected an electron beam having a diameter of 150 μm in the Y direction, thereby forming a straight locus having a length of 4 mm on the surface of a sample. The beam scanned the sample, using a beam current of 12 mA, a beam acceleration voltage of 12 KV, at the rate of 100 mm/sec. The sample had the same structure as shown in FIG. 9A. It consisted of a single crystal silicon disk 51 having crystal plane (100) and a diameter of 5 inches, a silicon oxide (insulative) layer 52 deposited on disk 51, a polycrystalline silicon (semiconductor) layer 53 deposited on layer 52, a tungsten (gap) layer 54 formed on layer 53, and a silicon nitride layer 55 formed on tungsten layer 54. Layers 52, 53, 54 and 55 had thicknesses of 1.3 μm, 0.6 μm, 0.5 μm and 0.5 μm, respectively.

After the scanning, a rectangular region of polycrystalline silicon layer 53, which had a width of 4 mm, was recrystallized, forming a single crystal silicon layer. This recrystallized layer had a very flat surface. Another sample was also scanned in the same manner as descried in the preceding paragraph. As shown in FIG. 9B, this sample is identical with the sample of FIG. 9A, except that silicon oxide layer 52 had a through hole filled up with polycrystalline silicon. After the scanning, a single crystal epitaxially grew first in the through hole of layer 52, upwardly from silicon disk 51, and then horizontally in polycrystalline silicon layer 53. As a result, a rectangular, single crystal silicon layer having a width of 4 mm and a crystal plane (100) was formed.

Figure 30:
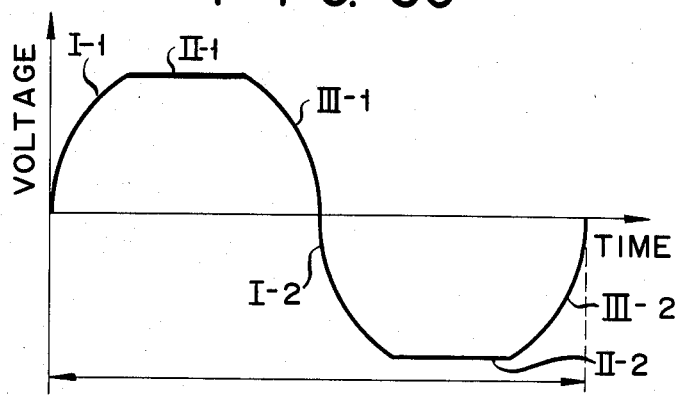
FIG. 30 shows the waveform of a modulation wave signal.

Instead of the deflection wave signal of FIG. 28 whose changing amplitude has a positive value, a deflection wave signal whose amplitude changes in the same way as that of the signal shown in FIG. 28 but has a negative value may be used to achieve the same results as described above. The waveform of either modulation wave signal has a point A where, as shown in FIG. 28, the differential coefficient abruptly changes. If the waveform is distorted at this point, A, this distortion is very prominent. Such a prominent distortion of the waveform results in a very uneven distribution of the probability for the beam spot to stay at any point on the sample. To avoid this undesirable phenomenon, the fundamental wave signal may be amplitude-modulated by a modulation wave signal of 10 KHz which has a waveform as is shown in FIG. 30. As shown in FIG. 30, this modulation wave signal is a series of waves, each consisting of a first half made of a curve I-1 ($y=t^{\frac{1}{2}}$), a horizontal straight line II-1 continuous to curve I-1 and a curve III-1 ($y=(a-t)^{\frac{1}{2}}$) continuous to line II-1, and the second half mode of a curve I-2 $y=-(t-a)^{\frac{1}{2}}$, a horizontal straight line II-2 continuous to curve I-2 and a curve III-3 ($y=-(a-t)^{\frac{1}{2}}$) continuous to line II-2. Moreover, the first and the second halves of each wave (FIG. 30) may be biased by a predetermined value in the positive and negative directions, respectively. If this measure is taken, an unpredictable maximum probability, if any, does not adversely influence the annealing of the sample.

EXAMPLE 11

Figure 31:
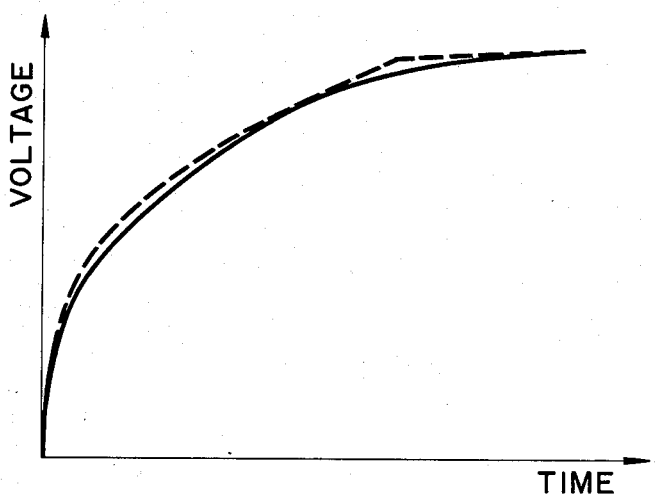
FIG. 31 shows curve I and a portion of an optimum modulation waveform.

As mentioned above, an even distribution of the probability for the beam spot to stay at any point on the sample can be achieved if use is made of a deflection signal having an appropriate waveform. FIG. 31 shows the waveform of such a deflection signal. In this figure, the broken line indicates curve I (FIG. 30), and the solid line shows the waveform of the deflection signal which helps to make said probability distribute evenly along the straight locus of the beam spot.

Figure 32:
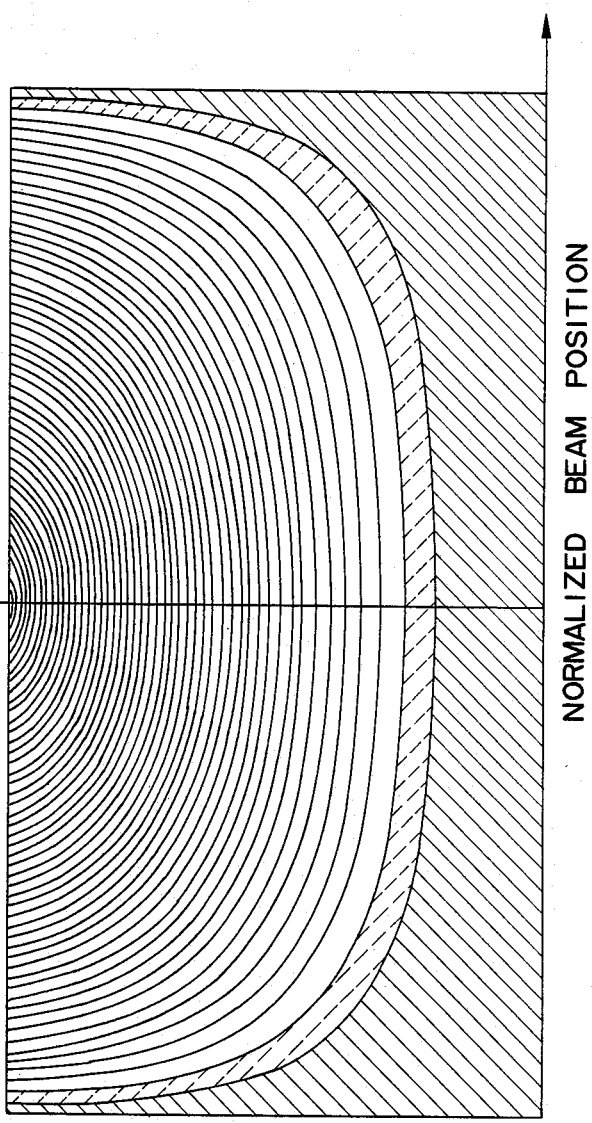
FIG. 32 is a diagram explaining how to obtain an optimum modulation wave signal from the ideal distribution of the probability for the beam spot to stay at any point along the straight locus of the beam spot.

It will be explained how to determine the desired waveform for a modulation wave signal, e.g., the curve represented by function of $y=t^{1/n}$ ($n \geq 2$), with reference to FIG. 32. Suppose a reference wave signal having a specific amplitude and a waveform represented by a specific function for example function of $t^{\frac{1}{2}}$ is chosen to be used to generate the modulation wave signal. Then, it is possible to calculate the distribution of the probability of the beam spot staying at any point on the sample when the beam is deflected by the deflection signal generated by using this modulation wave signal. Simultaneously, the two peaks of maximum probability can be obtained. Further, the number of other peaks that must exist in the region A0 near either peak to thereby eventy distribute the probability is determined. Once this number has been determined, it is detected how much each of these peaks contributes to the probability defined by the modulation wave signal. Thus, it is predicted that these peaks can correct the distribution of the probability in region A0. The waveforms of the other reference wave signals corresponding to these peaks are then determined. The amplitude and waveform of another reference wave corresponding to each pair of the probability peaks. By a similar method, the number of other peaks that must exist in the region A1 near the last obtained peak, to evenly distribute the probability and also to correct the probability distribution in region A0, is determined. Then, the waveforms of the other reference wave signals corresponding to these peaks are determined. Further, the number of peaks which must exist in regions A2, A3, . . . Ak are determined, and the waveforms of reference wave signals corresponding to these peaks are determined. All the reference wave signals whose waveforms have been determined are used, thus generating a modulation wave signal having an optimum waveform.

Such an optimum modulation wave signal was generated. A fundamental wave signal of 50 MHz was amplitude-modulated with this modulation wave signal, thus generating a deflection signal. The deflection signal was supplied to deflection electrodes 38. Electrodes 38 rapidly deflected an electron beam having a diameter of 150 μm in the Y direction, thereby forming a straight locus having a length of 4 mm on the surface of a sample. The beam scanned the sample, using a beam current of 12 mA, a beam acceleration voltage of 12 KV, at the speed of 100 mm/sec. The sample used in this example was identical with that used in Example 10.

Figure 33:
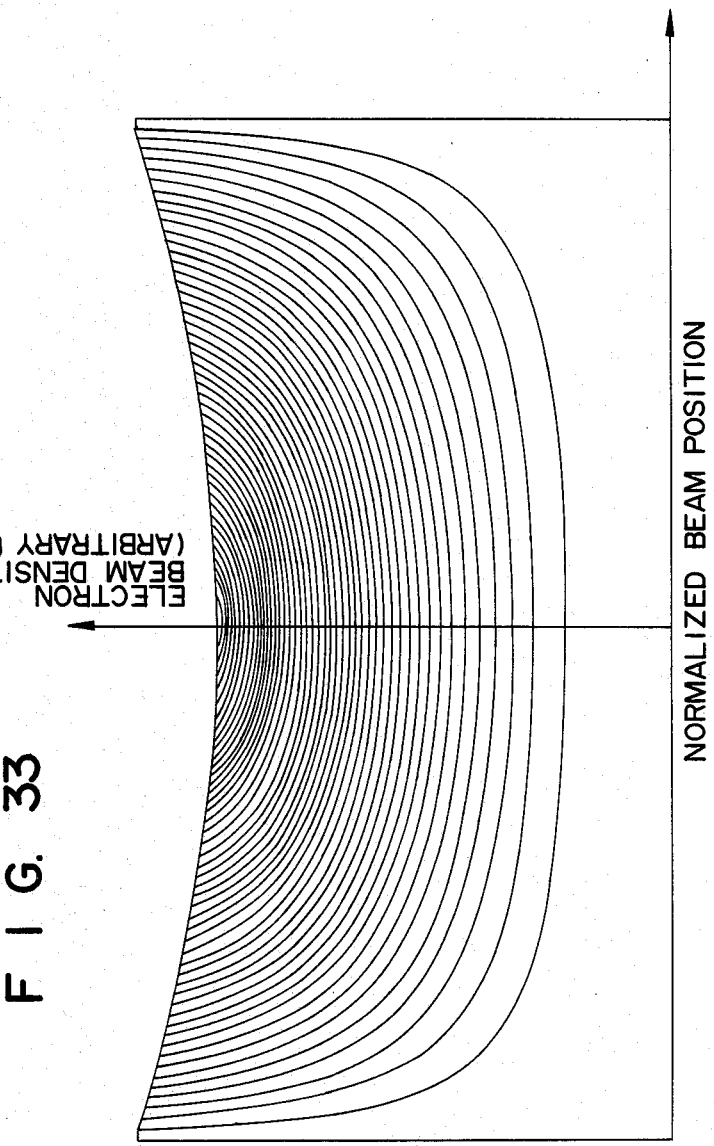
FIG. 33 is a diagram explaining how to obtain an optimum modulation wave signal from an ideal distribution of said probability which has been prepared in consideration of the physical properties of the sample.

After the scanning, a rectangular region of polycrystalline silicon layer 53. This region was narrower than the rectangular region annealed in Example 10. This is because, since the probability of the beam spot staying at any point on the sample is evenly distributed along the locus of the beam spot, heat dissipated from the edge portions of the annealed region, and these edge portions could not sufficiently be melted. To avoid such insufficient melting, such a deflection signal as would vary the distribution of said probability as illustrated in FIG. 33. If the probability varies as shown in this figure, the probability at the edge portion of the region is 10 to 20% higher than that at the center portion, and the entire region will be annealed to the same extent. The desired difference in the probability between the center portion and the edge portions depends on the heat dissipation from the sample. The thicker the polycrystalline silicon layer, the less the heat dissipation. The difference can be controlled by changing the lengths of curves I ($y=t^{1/n}$) and III ($Y=(a-t)^{1/n}$) of the modulation wave signal shown in FIG. 28.

Figure 34:
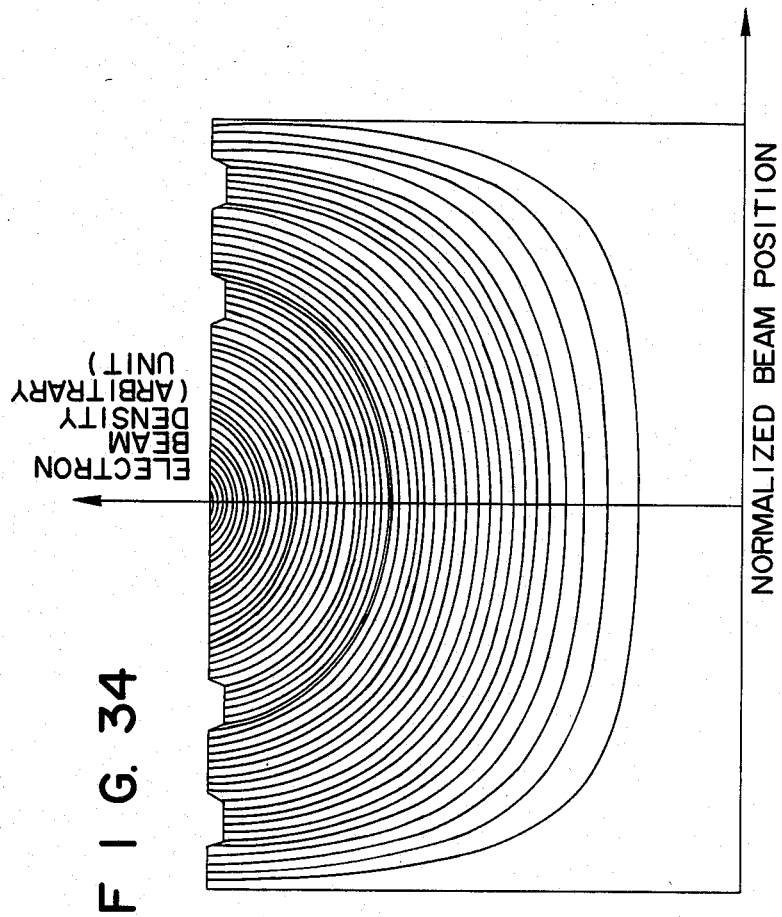
FIG. 34 is a diagram explaining how to obtain an optimum modulation wave signal from another ideal distribution of said probability which has been prepared in consideration of the physical properties of the sample.

In order to prevent the edge portions of the region of a sample from being insufficiently annealed due to the heat dissipation from these portions, such a modulation wave signal as would result in such a distribution of said probability as is illustrated in FIG. 34 may be used. The use of the modulation wave signal shown in FIG. 30 is important since the distribution of the probability defined by this modulation wave signal helps prevent the annealed regions of the sample from overlapping the scribe lines drawn on the sample.

Fifth Embodiment

FIG. 35 is a block diagram of a circuit for generating a high-frequency deflection signal whose base level cyclically changes. As shown in FIG. 35, this circuit comprises two oscillators 41 and 42, a mixer 90, an amplifier 44 and a deflector 45. Oscillators 41 and 42 generate high-frequency first and second deflection signals. Mixer 90 mixes these deflection wave signals. The output signal of mixer 90 is amplified by amplifier 44 and supplied to deflector 45. The output signal of deflector 45 is supplied to deflection electrodes 38 (FIG. 5). Electrodes 38 rapidly deflects an electron beam emitted from electron gun 31 in the Y direction to produce a pseudo-line-shaped beam, thus forming a straight locus of the beam spot on a sample. Simultaneously, the pseudo-line-shaped beam scans the sample in the X direction, thereby forming a single crystal silicon layer on the sample. This embodiment will be described in more detail by way of an example.

EXAMPLE 12

Oscillator 41 generated a sine wave (V sin ωt) signal having an amplitude of 50 V and an angular frequency of 2π×50 MHz·rad. On the other hand, oscillator 42 generated a sine wave [V sin(ωt/12)] signal having an amplitude of 50 V and an angular frequency of 2π×50 MHz·rad. Therefore, mixer 90 produced a signal having such a waveform as is shown in FIG. 36. This signal is represented by the following function:

$$y = V \sin \omega t + V \sin(\omega t/12) \tag{3}$$

This signal was amplified by amplifier 44 and supplied to deflector 45. The output of deflector 45 was supplied to deflection electrodes 38 (FIG. 5). Electrodes 38 rapidly deflected an electron beam having a diameter of 150 μm in the Y direction. The beam scanned the sample, using a beam current of 12 mA, at the rate of 100 mm/sec. The sample had the same structure as shown in FIG. 9A. It consisted of a single crystal silicon disk 51 having crystal plane (100) and a diameter of 5 inches, a silicon oxide (insulative) layer 52 deposited on disk 51, a polycrystalline silicon (semiconductor) layer 53 deposited on layer 52, a tungsten (gap) layer 54 formed on layer 53, and a silicon nitride layer 55 formed on tungsten layer 54. Layers 52, 53, 54 and 55 had thicknesses of 1.3 μm, 0.6 μm, 1 μm and 0.2 μm, respectively.

After the scanning, a rectangular region of polycrystalline silicon layer 53, which had a width of about 2 mm, was recrystallized, forming a single crystal silicon layer. This recrystallized layer had a very flat surface. Another sample was also scanned in the same manner as descried in the preceding paragraph. As shown in FIG. 9B, this sample is identical with the sample of FIG. 9A, except that silicon oxide layer 52 had a through hole filled up with polycrystalline silicon. After the scanning, a single crystal epitaxially grew first in the through hole of layer 52, upwardly from silicon disk 51, and then horizontally in polycrystalline silicon layer 53. As a result, a rectangular, single crystal silicon layer having a width of 2 mm, a length of 10 mm and a crystal plane (100) was formed.

In Example 12, two sine wave signals were used to generate the deflection signal. These signals may be replaced by triangular wave signals, polygonal wave signals or saw-tooth wave signals. Further, the sine wave signals may contain DC components.

According to the present invention, the probability of the beam spot staying at any point on the sample can be evenly distributed along the locus of the beam spot, thereby melting and recrystallizing a larger area of the semiconductor layer of the sample. Since this probability can be distributed to have many, relatively low peaks. The surface temperature of the region to be annealed can thus be accurately controlled. As a result, a flat, large, single crystal silicon layer can be formed on the sample.

The present invention is not limited to Embodiments 1-5, in which an electron beam is rapidly deflected in the Y direction, thereby forming a single crystal silicon layer on a sample. Another energy beam, e.g., an ion beam or a laser beam may be rapidly deflected in the Y direction for the same purpose. An ion beam can be rapidly deflected by an electric field or a magnetic field, and a laser beam can be rapidly deflected by a electric field, utilizing the Pockels effect. Moreover, the substrate of the sample is not limited to a silicon disk. Other semiconductor substrates, such as GaAs, Ge, or InP substrates, may be used. Further, the insulative layer, i.e., the silicon oxide layer, may have various thicknesses. The silicon oxide layer can be replaced by another insulative layer, e.g., an Si-N layer, $Al_2O_3$ layer or the like. Still further, the semiconductor layer formed on the insulative layer may be formed of amorphous silicon, Ge, GaAs, InP or the like, instead of polycrystalline silicon.

What is claimed is:

1. A method of forming a single crystal semiconductor layer from a non-single crystalline material having a surface, comprising the steps of:
   radiating an energy beam to the surface of the non-single-crystalline material;
   rapidly oscillating the energy beam with a high frequency signal having a modulated amplitude in first one and opposite directions to form a beam locus having a varying width on the surface of the non-single crystalline material;
   deflecting the beam locus in a second direction different from the first directions; and
   annealing the surface radiated by the beam locus, thereby forming a single crystal semiconductor layer on the annealed surface.

2. The method according to claim 1, wherein said energy beam is an electron beam.

3. The method according to claim 1, wherein said energy beam is an ion beam.

4. The method according to claim 1, wherein said energy beam is a laser beam.

5. A method of forming a single crystal semiconductor layer from a non-single crystalline material having a surface, comprising the steps of:
   radiating an electron beam to the surface of the non-single crystalline material;
   rapidly oscillating the electron beam with a high frequency signal having a modulated amplitude in first one and opposite directions to form a beam locus having a varying width on the surface of the non-single crystalline material;
   deflecting the beam locus in a second direction different from the first directions; and
   annealing the surface radiated by the beam locus, thereby forming a single crystal semiconductor layer on the annealed surface.

6. The method according to claim 5, wherein the electron beam is deflected in a first direction by a deflection voltage generated by modulating the amplitude of a high-frequency fundamental wave signal with a modulation wave signal having a frequency lower than that of the fundamental wave signal.

7. The method according to claim 6, wherein said electron beam forms a spot having a diameter b on the surface of the sample, the electron beam is deflected at rate v, and said modulation wave signal has a frequency F ($=\omega 1$) which is given:

$$F \cdot (b/v) \geq 1.$$

8. The method according to claim 6, wherein said modulation wave signal has one of a sine waveform, a triangular waveform, a polygonal waveform and a saw-tooth waveform.

9. The method according to claim 6, wherein the amplitude of said modulation wave signal changes in both the positive direction and the negative direction from a reference potential to different extents.

10. The method according to claim 6, wherein said modulation wave signal is generated by modulating the amplitude of a first modulation wave signal with a second modulation wave signal.

11. The method according to claim 10, wherein said first modulation wave signal is out of phase with respect to said second modulation wave signal.

12. The method according to claim 10, wherein said first modulation wave signal has an amplitude different from that of said second modulation wave signal.

13. The method according to claim 10, wherein the amplitude of said first modulation wave signal changes in both the positive direction and the negative direction from a reference potential.

14. The method according to claim 10, wherein said second modulation wave signal has one of a sine waveform, a triangular waveform, a polygonal waveform and a saw-tooth waveform.

15. The method according to claim 10, wherein said modulation wave signal is generated by adding said first and second modulation wave signals.

16. The method according to claim 10, wherein said modulation wave signal has a waveform including function of $y = t^{1/n}$, and n is not smaller than two.

17. The method according to claim 10, wherein said high-frequency fundamental wave signal has a frequency not lower than 50 MHz.

18. The method according to claim 15, wherein said first modulation wave signal has an amplitude different from that of said second modulation wave signal.

19. The method according to claim 15, wherein said second modulation wave signal has one of a sine waveform, a triangular waveform, a polygonal waveform and a saw-tooth waveform.

20. The method according to claim 16, wherein said modulation wave signal has a waveform substantially defined by a curve represented by the function $y = t^{1/n}$, a horizontal straight line continuous to the first curve, and a second curve represented by function $y = -(a-t)^{1/n}$ and continuous to the horizontal straight line, and n is not smaller than two.

21. The method according to claim 16, wherein said modulation wave signal has a waveform the first half of which is substantially defined by a curve represented by the function $y = t^{1/n}$, a first horizontal straight line continuous to the first curve, and a second curve represented by the function $y = (a-t)^{1/n}$ and continuous to the first horizontal straight line, and the second half of which is substantially defined by a third curve represented by the function $y = -(t-a)^{1/n}$, a second horizontal straight line continuous to the third curve, and a fourth curve represented by the function $y = -(a-t)^{1/n}$ and continuous to the second horizontal straight line.

22. The method according to claim 20, wherein said modulation wave signal has a frequency of not lower than 10 KHz.

23. The method according to claim 20, wherein said modulation wave signal has a frequency of not higher than 10 KHz.

24. The method according to claim 20, wherein said modulation wave signal has a frequency of about 1 KHz.

25. A method of forming a single crystal semiconductor layer from a non-single crystalline material having a surface, comprising the steps of:
   radiating an electron beam to the surface of the non-single crystalline material;
   rapidly oscillating the electron beam with a high frequency signal having a constant amplitude and a varying base level in first one and opposite directions to form a beam locus having a constant radiation width and a varying radiation range, the surface of the non-single crystalline material being radiated by the beam locus;

deflecting the beam locus in a second direction different from the first direction; and annealing the surface radiated by the beam locus, thereby forming a single crystal semiconductor layer on the annealed surface.

26. The method according to claim 25, wherein the electron beam is deflected in a first direction by a deflection voltage generated by modulating the amplitude of a high frequency fundamental wave signal with a modulation wave signal having a frequency lower than that of the fundamental wave signal.

27. The method according to claim 26, wherein said modulation wave signal has one of a sine waveform, a triangular waveform, a polygonal waveform and a saw-toothed waveform.

28. The method according to claim 26, wherein the phase of the deflection signal is shifted by 180° from the deflection signal used in adjacent regions.

29. A method of forming a single crystal semiconductor layer from a non-single-crystalline material having a surface, comprising the steps of:

radiating an electron beam to the surface of the non-single-crystalline material;

rapidly deflecting the electron beam in a first direction, by a deflection voltage generated by modulating the amplitude of a high frequency fundamental wave signal with a modulation wave signal having a frequency lower than that of the fundamental wave signal;

thus forming a locus of the beam spot on the surface, while changing the range of deflecting the electron beam in the first direction;

said electron beam being deflected at rate v, and said modulation wave signal having a frequency F $(=\omega 1)$ which is given: $F \cdot (b/v) \geq 1$;

deflecting the electron beam in a second direction different from the first direction; and annealing a region of the material by the deflected electron beam, thereby forming a single crystal semiconductor layer.

30. A method of forming a single crystal semiconductor layer from a non-single-crystalline material having a surface, comprising the steps of:

radiating an electron beam to the surface of the non-single-crystalline material;

rapidly deflecting the electron beam in a first direction, by a deflection voltage generated by modulating the amplitude of a high frequency fundamental wave signal with a modulation wave signal having a frequency lower than that of the fundamental wave signal;

thus forming a locus of the beam spot on the surface, while changing the range of deflecting the electron beam in the first direction;

said modulation wave signal having one of a sine waveform, a triangular waveform, a polygonal waveform and a saw-toothed waveform;

deflecting the electron beam in a second direction different from the first direction; and annealing a region of the material by the deflected electron beam, thereby forming a single crystal semiconductor layer.

31. A method of forming a single crystal semiconductor layer from a non-single-crystalline material having a surface, comprising the steps of:

radiating an electron beam to the surface of the non-single-crystalline material;

rapidly deflecting the electron beam in a first direction, by a deflection voltage generated by modulating the amplitude of a high frequency fundamental wave signal with a modulation wave signal having a frequency lower than that of the fundamental wave signal;

thus forming a locus of the beam spot on the surface, while changing the range of deflecting the electron beam in the first direction;

the amplitude of said modulation wave signal changing in both the positive direction and the negative direction from a reference potential to different extents;

deflecting the electron beam in a second direction different from the first direction; and annealing a region of the material by the deflected electron beam, thereby forming a single crystal semiconductor layer.

32. A method of forming a single crystal semiconductor layer from a non-single-crystalline material having a surface, comprising the steps of:

radiating an electron beam to the surface of the non-single-crystalline material;

rapidly deflecting the electron beam in a first direction, by a deflection voltage generated by modulating the amplitude of a high frequency fundamental wave signal with a modulation wave signal having a frequency lower than that of the fundamental wave signal;

thus forming a locus of the beam spot on the surface, while changing the range of deflecting the electron beam in the first direction;

said modulation wave signal being generated by modulating the amplitude of a first modulation wave signal with a second modulation wave signal;

deflecting the electron beam in a second direction different from the first direction; and annealing a region of the material by the deflected electron beam, thereby forming a single crystal semiconductor layer.

* * * * *